(12) United States Patent
Takahashi

(10) Patent No.: US 11,437,416 B2
(45) Date of Patent: Sep. 6, 2022

(54) PIXEL DEVICE LAYOUT TO REDUCE PIXEL NOISE

(71) Applicant: Taiwan Semiconductor Manufacturing Co., Ltd., Hsin-Chu (TW)

(72) Inventor: Seiji Takahashi, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 40 days.

(21) Appl. No.: 16/565,892

(22) Filed: Sep. 10, 2019

(65) Prior Publication Data

US 2021/0074747 A1    Mar. 11, 2021

(51) Int. Cl.
*H01L 27/146* (2006.01)
*H04N 5/378* (2011.01)

(52) U.S. Cl.
CPC .... *H01L 27/14605* (2013.01); *H01L 27/1463* (2013.01); *H01L 27/14612* (2013.01); *H01L 27/14636* (2013.01); *H01L 27/14643* (2013.01); *H01L 27/14689* (2013.01); *H01L 27/1464* (2013.01); *H01L 27/14621* (2013.01); *H01L 27/14627* (2013.01); *H01L 27/14685* (2013.01); *H04N 5/378* (2013.01)

(58) Field of Classification Search
CPC ......... H01L 27/14605; H01L 27/14643; H01L 27/1463; H01L 27/14612
See application file for complete search history.

(56) References Cited

U.S. PATENT DOCUMENTS

| | | | |
|---|---|---|---|
| 2016/0111461 A1* | 4/2016 | Ahn | H01L 27/14612 250/208.1 |
| 2020/0161348 A1* | 5/2020 | Lee | H01L 27/14609 |
| 2020/0176500 A1* | 6/2020 | Sze | H01L 27/14614 |
| 2020/0266229 A1 | 8/2020 | Takahashi et al. | |

* cited by examiner

*Primary Examiner* — Phat X Cao
(74) *Attorney, Agent, or Firm* — Eschweiler & Potashnik, LLC

(57) ABSTRACT

Various embodiments of the present disclosure are directed towards an image sensor including a first photodetector and a second photodetector each disposed within a semiconductor substrate. An isolation structure extends from a front-side surface of the semiconductor substrate to a back-side surface of the semiconductor substrate. The front-side surface is opposite the back-side surface and the isolation structure is laterally between the first and second photodetectors. A readout transistor is disposed on the front-side surface of the semiconductor substrate. A first side of the readout transistor overlies the first photodetector and a second side of the readout transistor overlies the second photodetector. The first side is opposite the second side and the readout transistor continuously extends over the isolation structure.

20 Claims, 11 Drawing Sheets

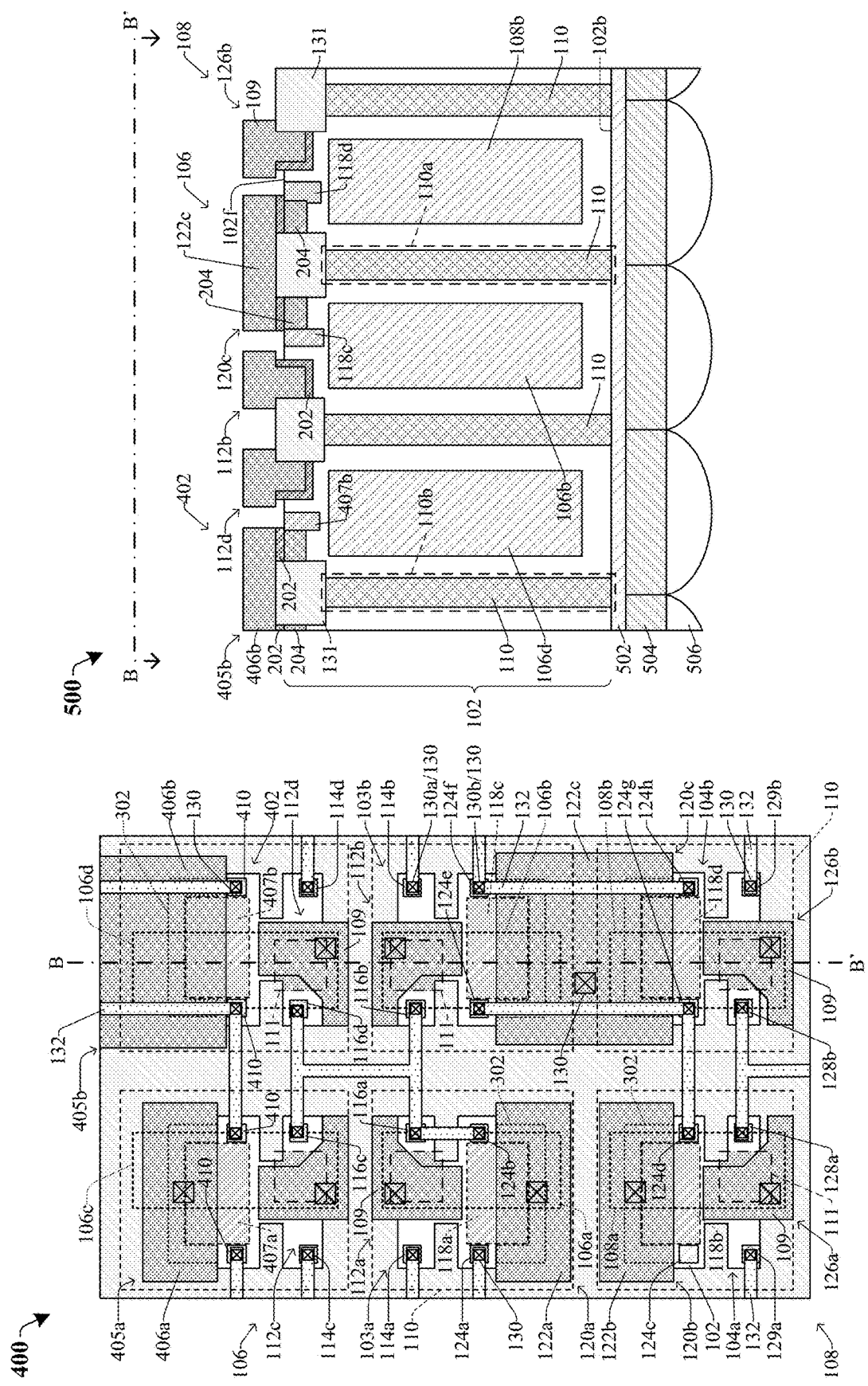

PIXEL DEVICE LAYOUT TO REDUCE PIXEL NOISE

BACKGROUND

Many modern day electronic devices (e.g., digital cameras, optical imaging devices, etc.) comprise image sensors. Image sensors convert optical images to digital data that may be represented as digital images. An image sensor includes an array of pixel sensors, which are unit devices for the conversion of an optical image into digital data. Some types of pixel sensors include charge-coupled device (CCD) image sensors and complementary metal-oxide-semiconductor (CMOS) image sensors (CISs). Compared to CCD image sensors, CISs are favored due to, among other things, low power consumption, small size, fast data processing, a direct output of data, and low manufacturing cost.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4 illustrates a layout view of some embodiments of an image sensor having multiple pixel sensors and a pixel device that extends over an isolation structure.

FIG. 5 illustrates a cross-sectional view of some alternative embodiments of the image sensor of FIG. 4, according to the line B-B'.

DETAILED DESCRIPTION

Figure 1:
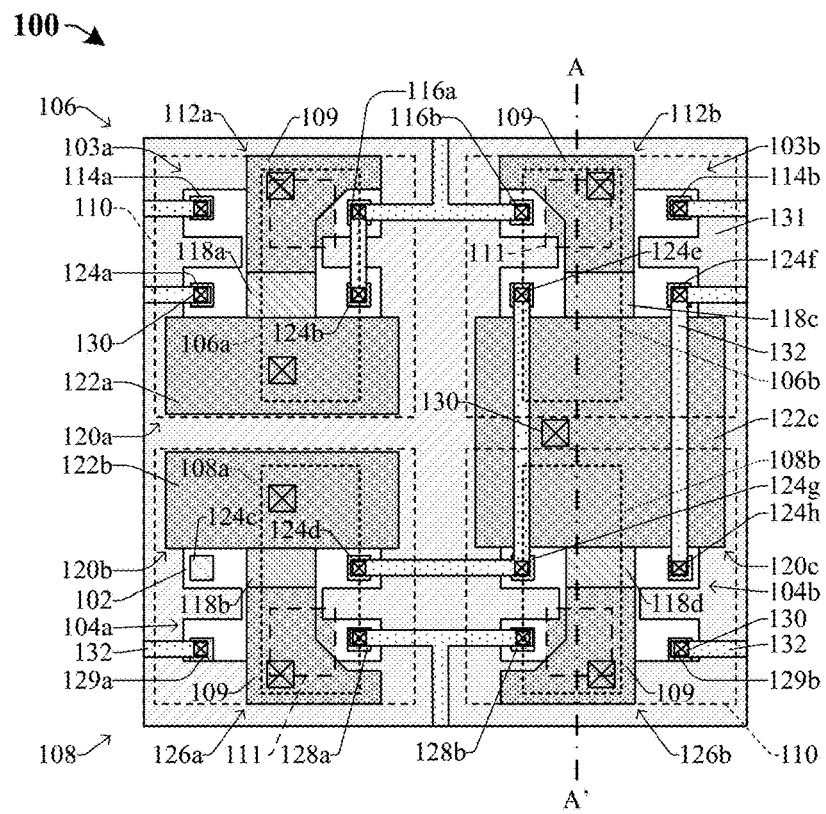
FIG. 1 illustrates a layout view of some embodiments of an image sensor having a pixel device that extends over an isolation structure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some complementary metal-oxide semiconductor image sensors (CISs) have an array of pixel sensors. A pixel sensor of the array of pixel sensors includes an array of photodetectors (e.g., a 2×2 photodetector array) disposed in a semiconductor substrate. In some embodiments, the photodetectors may be separated from one another by an isolation structure (e.g., a full-depth isolation structure). Further, the pixel sensor includes a plurality of pixel devices (e.g., a transfer transistor, a reset transistor, a source-follower transistor, and/or a row-select transistor) that are disposed on an active region of the semiconductor substrate. Typically, the plurality of pixel devices is disposed laterally adjacent to a respective array of photodetectors and do not extend across the isolation structure. An interconnect structure overlies the semiconductor substrate and the pixel devices. The interconnect structure electrically couples the photodetectors and the pixel devices together. The pixel sensor records incident radiation (e.g., photons) using the photodetectors and facilitates digital readout of the recording with the pixel devices.

One challenge with the above CISs is poor noise performance (e.g., random noise, fixed-pattern noise, flicker noise, shot noise, thermal noise, white noise, etc.). One contributor to noise performance is sizes of the plurality of pixel devices (e.g., a size of the source-follower device). In some embodiments, the isolation structure is a full depth deep trench isolation (DTI) structure that extends from a front-side to a back-side of a semiconductor substrate. The front-side is opposite the back-side. In such embodiments, the full depth DTI structure may improve full well capacity of the image sensor and/or increase electrical isolation between adjacent photodetectors and/or pixel devices disposed within/over the semiconductor substrate. Because the isolation structure is a full depth DTI structure, it will consume surface area of the semiconductor substrate, thereby reducing a size of the active region of the semiconductor substrate. Further, the pixel sensors are confined to overlying the active region of the semiconductor substrate, where the pixel sensors generally do not overlie the full depth DTI structure. Thus, in order to accommodate the full depth DTI structure, the pixel devices are typically shrunk in order for the pixel devices, the isolation structure, and the photodetectors to be disposed on/in the semiconductor substrate. However, reducing the sizes of the pixel devices negatively affects noise (e.g., due to a size of the source-follower device being reduced), thereby contributing to poor noise performance. In such embodiments, as the size of the pixel devices are decreased, an effective length of a selectively formable channel under each gate electrode (e.g., a source-follower gate electrode) of the pixel devices is decreased. As the effective length of the selectively formable channel decreases, flicker noise present in the pixel devices will increase. This increases noise in the image sensor, thereby decreasing an accuracy and/or reliability of images produced from the image sensor.

Various embodiments of the present disclosure are directed toward an image sensor including at least one pixel device that extends over an isolation structure (e.g., a full-depth DTI structure) disposed between first and second pixel sensors. The first and second pixel sensors are adjacent to one another. The first and second pixel sensors each include an array of photodetectors (e.g., a 2×2 photodetector array) and multiple pixel devices. The multiple pixel devices may include readout transistors, such as a reset transistor, a source-follower transistor, a select transistor, a transfer transistor, etc. The array of photodetectors and the multiple pixel devices are respectively disposed on and/or within a semiconductor substrate. The isolation structure is disposed within the semiconductor substrate and laterally wraps around each photodetector of the adjacent pixel sensors. A readout transistor (e.g., a source-follower transistor) is disposed on the semiconductor substrate and laterally extends over the isolation structure. The readout transistor continuously extends from over a photodetector in the first pixel sensor to over a photodetector in the second pixel sensor.

Because the readout transistor continuously extends over the isolation structure between adjacent pixel sensors, the readout transistor may have an enlarged gate electrode. Further, the readout transistor may be configured to function as two transistors in parallel with one another with a single conductive contact overlying the readout gate electrode. In such embodiments, a metal line and another conductive contact that otherwise would be used to electrically couple two gate electrodes in parallel with one another are omitted, thereby decreasing a total conductive density of the interconnect structure (e.g., decreasing parasitic capacitance present in the interconnect structure). Additionally, because the readout transistor may function as two transistors in parallel with one another, an effective channel resistance of the readout transistor may be reduced. This, in part, decreases a noise in the readout transistor, thereby increasing an accuracy and/or reliability of images produced from the image sensor.

In addition, a first source/drain region and a second source/drain region of the readout transistor are respectively disposed along a first side of the readout gate electrode. A junction isolation structure is disposed laterally between the first and second source/drain regions. In some embodiments, the junction isolation structure may extend a distance under the readout gate electrode toward a second side of the readout gate electrode that is opposite the first side. As the distance increases, an effective length of a selectively conductive channel underlying the readout gate electrode and between the first and second source/drain regions is increased. As the effective length is increased, noise (e.g., flicker noise) present in the readout transistor is decreased. This further decreases the noise in the readout transistor, thereby further increasing the accuracy and/or reliability of images produced from the image sensor.

Figure 2:
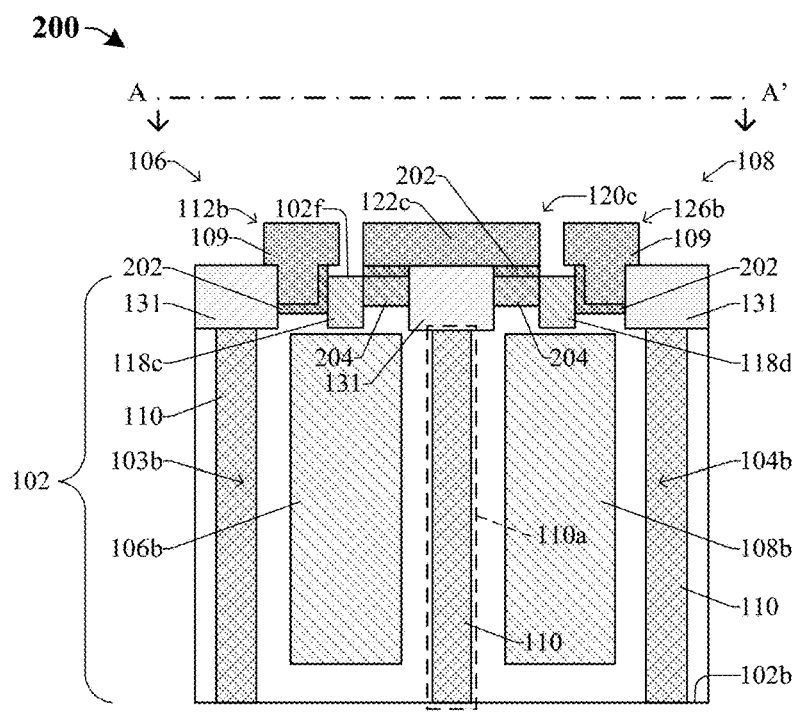
FIG. 2 illustrates a cross-sectional view of some alternative embodiments of the image sensor of FIG. 1, according to the line A-A'.

FIG. 1 illustrates a layout view of some embodiments of an image sensor 100 having a readout transistor 120c that extends over a first isolation structure 110 (show in phantom). The first isolation structure 110 may, for example, be referred to as a deep trench isolation (DTI) structure). FIG. 2 illustrates a cross-sectional view 200 of some alternative embodiments of the image sensor 100 of FIG. 1 according to the line A-A'.

As illustrated in FIG. 1, the image sensor 100 includes a first pixel sensor 106 and a second pixel sensor 108 respectively disposed on a substrate 102. In some embodiments, the substrate 102 is a bulk substrate (e.g., silicon) comprising a first doping type (e.g., p-type). The first pixel sensor 106 may comprise a first plurality of photodetectors 106a-b (shown in phantom), and the second pixel sensor 108 may comprise a second plurality of photodetectors 108a-b (shown in phantom). The first and second plurality of photodetectors 106a-b, 108a-b (e.g., photodiodes) are respectively configured to absorb incident radiation (e.g., photons) and generate electrical signals corresponding to the incident radiation. The first and second plurality of photodetectors 106a-b, 108a-b are disposed within the substrate 102 and each comprise a second doping type (e.g., n-type) opposite the first doping type. In some embodiments, the first doping type is p-type and the second doping type is n-type, or vice versa. The first isolation structure 110 is disposed in the substrate 102 and laterally surrounds each photodetector in the first and second plurality of photodetectors 106a-b, 108a-b. A second isolation structure 131 (in some embodiments, referred to as a shallow trench isolation (STI) structure) overlies the substrate 102 and the first isolation structure 110 when viewed in cross section.

A first plurality of pickup well contact regions 114a-b is disposed in the substrate 102. The first plurality of pickup well contact regions 114a-b corresponds to the first plurality of photodetectors 106a-b, respectively. Further, a second plurality of pickup well contact regions 129a-b is disposed in the substrate 102 and respectively corresponds to the second plurality of photodetectors 108a-b. The first and second plurality of pickup well contact regions 114a-b, 129a-b may each comprise a same doing type as the substrate 102, for example the first doping type (e.g., p-type), with a higher doping concentration than the substrate 102.

A first plurality of floating diffusion nodes 116a-b is disposed in the substrate 102 and respectively corresponds to the first plurality of photodetectors 106a-b. A second plurality of floating diffusion nodes 128a-b is disposed in the substrate 102 and respectively corresponds to the second plurality of photodetectors 108a-b. The first and second plurality of floating diffusion nodes 116a-b may each comprise the second doping type (e.g., n-type) with a higher doping concentration than the substrate 102.

A first plurality of transfer transistors 112a-b is disposed over/in the substrate 102 and the transfer transistors 112a-b each overlie a respective photodetector in the first plurality of photodetectors 106a-b. For example, a first transfer transistor 112a overlies a first photodetector 106a and a second transfer transistor 112b overlies a second photodetector 106b. A second plurality of transfer transistors 126a-b is disposed over/in the substrate 102 and the transfer transistors 126a-b each overlie a respective photodetector in the second plurality of photodetectors 108a-b. In some embodiments, the first and second plurality of transfer transistors 112a-b, 126a-b are respectively configured to form a conductive channel between a corresponding photodetector and a corresponding floating diffusion node, wherein charge accumulated (e.g., via absorbing incident radiation) in the corresponding photodetector may be transferred to the corresponding floating diffusion node. For example, the first transfer transistor 112a is configured to form a conductive channel between the first photodetector 106a and a first floating diffusion node 116a, wherein charge accumulated in the first photodetector 106a may be transferred to the first floating diffusion node 116a. In some embodiments, each transfer transistor in the first and second plurality of transfer transistors 112a-b, 126a-b comprises a transfer gate electrode 109 that has an embedded conductive body 111 extending into the substrate 102. Further, at least a portion of the transfer gate electrodes 109 are each separated from the substrate 102 by a gate dielectric layer (e.g., a gate dielectric layer 202 of FIG. 2).

A first plurality of readout transistors 120a-c (e.g., reset transistor, source-follower transistor, row-select transistor, etc.) is disposed on the substrate 102. In some embodiments, the first plurality of readout transistors 120a-c respectively comprise readout gate electrodes 122a-c and source/drain regions 124a-h. In some embodiments, the first plurality of readout transistors 120a-c may each be, for example, a metal-oxide semiconductor field-effect transistor (MOSFET), a bipolar junction transistor (BJT), a high-electron-mobility transistor (HEMTs), or the like.

In some embodiments, a first readout transistor 120a comprises a first readout gate electrode 122a and source/drain regions 124a-b. A second readout transistor 120b comprises a second readout gate electrode 122b and source/drain regions 124c-d. A third readout transistor 120c comprises a third readout gate electrode 122c and source/drain regions 124e-h. The readout transistors 120a-c each comprise a gate dielectric layer (e.g., the third readout transistor 120c comprises the gate dielectric layer 202 of FIG. 2) that separates each readout transistor 120a-c from the substrate 102.

A first plurality of junction isolation structures 118a-d is in the substrate 102, and the junction isolation structures 118a-d are each disposed between a readout transistor 120a-c and a gate electrode neighboring the readout transistor. The first plurality of junction isolation structures 118a-d is configured to increase isolation between the source/drain regions 124a-h. In some embodiments, the junction isolation structures 118a-d each comprises the first doping type (e.g., p-type) with a greater doping concentration than the substrate 102.

A plurality of conductive vias 130 and a plurality of conductive wires 132 overlie the substrate 102 (when viewed in cross section) and electrically coupled devices and/or doped regions (e.g., the first plurality of readout transistors 120a-c, the source/drain regions 124a-d, the first plurality of pickup well contact regions 114a-b, etc.) to one another. When viewed in cross section, the plurality of conductive vias 130 respectively extend from a lower surface of the plurality of conductive wires 132 to an underlying device or doped region. In some embodiments, the conductive vias and wires 130, 132 are a part of an interconnect structure overlying the substrate 102 when viewed in cross section. For clarity in FIG. 1, the first conductive vias 130 are illustrated by an "X" disposed in a box.

The substrate 102 includes a first plurality of active regions 103a-b and a second plurality of active regions 104a-b. The first and second plurality of active regions 103a-b, 104a-b respectively comprise doped regions of the first and second pixel sensors 106, 108. For example, the first plurality of active regions 103a-b includes the first plurality of photodetectors 106a-b, the first plurality of pickup well contact regions 114a-b, and the first plurality of floating diffusion nodes 116a-b. Thus, the first plurality of active regions 103a-b corresponds to the first pixel sensor 106. In another example, the second plurality of active regions 104a-b includes the second plurality of photodetectors 108a-b, the second plurality of pickup well contact regions 129a-b, and the second plurality of floating diffusion nodes 128a-b. Thus, the second plurality of active regions 104a-b corresponds to the second pixel sensor 108.

The first plurality of readout transistors 120a-c are configured to conduct readout of the charge accumulated by the first plurality of photodetectors 106a-b. In some embodiments, the first readout transistor 120a is configured as a reset transistor, the second readout transistor 120b is configured as a row-select transistor, and the third readout transistor 120c is configured as a source-follower transistor. Because the third readout transistor 120c extends over the first isolation structure 110 (and/or the second isolation structure 131) from the first plurality of photodetectors 106a-b to the second plurality of photodetectors 108a-b, an effective size of the third readout transistor 120c is increased. This is because the third readout transistor 120c may function as two transistors in parallel (as explained in FIG. 7). Thus, the size of the third readout transistor 120c may be larger than if the third readout transistor 120c was constrained to directly overlie/be disposed in a single active region in the first and/or second plurality of active regions 103a-b, 104a-b. Accordingly, a presence of noise (e.g., flicker noise) in the image sensor 100 is reduced, thereby increasing a reliability, endurance, and performance of the image sensor 100.

Further, in some embodiments, by disposing the second readout transistor 120b over a first active region 104a of the second plurality of active regions 104a-b, the readout transistors 120a-c are not in close proximity to one another. Thus, the size of the second readout transistor 120b may be larger than if the second readout transistor 120b was disposed adjacent to another readout transistor device in the first active region 104a. This further reduces a presence of noise (e.g., flicker noise) in the image sensor 100, thereby further increasing a reliability, endurance, and performance of the image sensor 100.

In some embodiments, another contributor to noise is a total conductive density of the interconnect structure (e.g., the conductive vias and wires 130, 132). For example, as the number of conductive vias and/or wires 130, 132 increases, a parasitic capacitance between the conductive elements in the interconnect structure increases. This increases noise in the image sensor 100. By virtue of the third readout gate electrode 122c extending over the first isolation structure 110 and between the source/drain regions 124e-f and the source/drain regions 124g-h, a single conductive via 130 overlies the third readout gate electrode 122c. This allows the third readout transistor 120c to function as two transistors in parallel, thereby reducing an effective channel resistance of the third readout transistor 120c while reducing a total conductive density of the interconnect structure. Accordingly, the image sensor 100 may have further improved noise performance, while reducing time and costs associated with forming the image sensor 100.

As illustrated in FIG. 2, the substrate 102 has a front-side 102f opposite a back-side 102b. The second isolation structure 131 extends from above the front-side 102f to a point in the substrate 102 below the front-side 102f. The first isolation structure 110 extends from the back-side 102b to the point in the substrate 102, wherein a top surface of the first isolation structure 110 directly contacts and/or is aligned with a bottom surface of the second isolation structure 131.

In such embodiments, the first and second isolation structures 110, 131 may form a full depth deep trench isolation (DTI) structure that extends completely through the substrate 102. This, in part, may increase a well capacity of the image sensor 100.

A readout transistor well region 204 may be disposed in the substrate 102 and directly underlie the third readout transistor 120c. In some embodiments, the third readout transistor 120c may be configured to form a conductive channel in the readout transistor well region 204. In further embodiments, the readout transistor well region 204 may comprise the first doping type (e.g., p-type) with a higher doping concentration than the substrate 102. The third readout transistor 120c overlies the second photodetector 106b of the first plurality of photodetectors 106a-b and overlies the second photodetector 108b of the second plurality of photodetectors 108a-b. Further, the third readout transistor 120c continuously extends over a segment 110a of the first isolation structure 110 that is laterally between the second photodetector 106b of the first plurality of photodetectors 106a-b and the second photodetector 108b of the second plurality of photodetectors 108a-b.

Figure 3A:
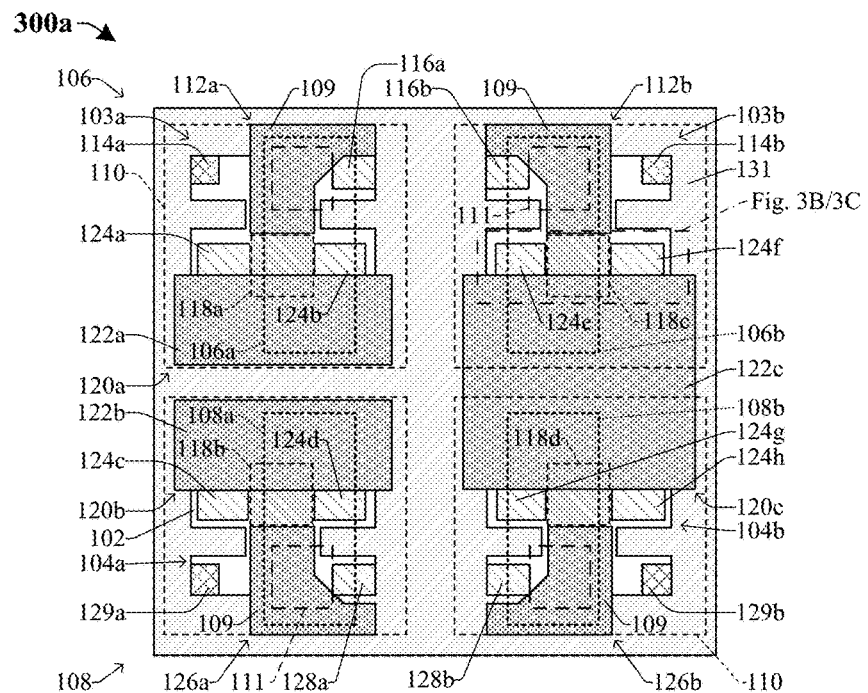
FIG. 3A illustrates a layout view of some embodiments of an image sensor having multiple pixel devices that respectively have source/drain regions disposed on a single side of a gate electrode.

FIG. 3A illustrates a layout view of an image sensor 300a according to some alternative embodiments of the image sensor 100 of FIG. 1. The image sensor 300a of FIG. 3A illustrates the image sensor 100 of FIG. 1 without the conductive vias and wires 130, 132.

As illustrated in FIG. 3A, at least a portion of each junction isolation structure 118a-d directly underlies a respective readout gate electrode 122a-c. In some embodiments, the junction isolation structures 118a-d each comprise the first doping type (e.g., p-type) with a doping concentration within a range of about $10^{17}$ to $10^{19}$ atoms/cm$^3$. In further embodiments, the source/drain regions 124a-h respectively have the second doping type (e.g., n-type) with a doping concentration approximately equal to the junction isolation structures 118a-d (e.g., within a range of about $10^{17}$ to $10^{19}$ atoms/cm$^3$). Because the junction isolation structures 118a-d directly underlie a respective readout gate electrode 122a-c and each source/drain pair 124a-h is localized to a single side of its corresponding gate electrode 122a-c, an effective length of an underlying conductive channel may be increased (e.g., as illustrated and described in FIGS. 3B-C). By increasing the effective length of the conductive channel underlying each readout gate electrode 122a-c, the image sensor 300a may have improved noise performance.

Figure 3B:
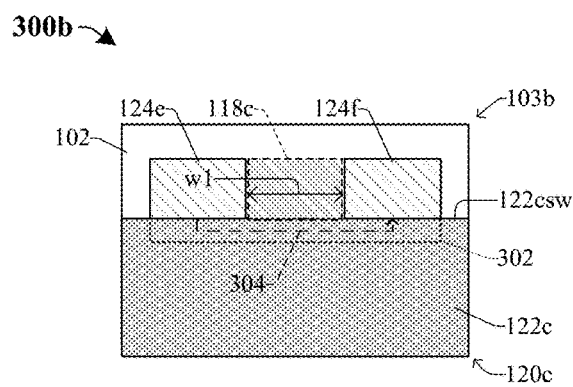
FIGS. 3B and 3C illustrate layout views of some alternative embodiments of a section of the image sensor of FIG. 3A, as indicated by the dashed box in FIG. 3A.

FIG. 3B illustrates a cross-sectional view 300b of some alternative embodiments of a section of the image sensor 300a of FIG. 3A as indicated by the dashed box in FIG. 3A.

A readout gate insulator layer 302 is disposed between the third readout gate electrode 122c and the front-side (102f of FIG. 2) of the substrate 102 when viewed in cross section. In some embodiments, the readout gate insulator layer 302 functions as a gate dielectric layer and/or may, for example, be or comprise silicon oxide, silicon oxy-nitride, silicon nitride, or a high-k dielectric material, such as tantalum oxide, aluminum oxide, lanthanum oxide, hafnium oxide, zirconium oxide, zirconium aluminum oxide, hafnium aluminum oxide, titanium bromide oxide, strontium titanium oxide, a combination of the aforementioned, or the like. As used herein, a high-k dielectric material is a dielectric material with a dielectric constant greater than 3.9. In yet further embodiments, the readout gate insulator layer 302 may be a portion of the gate dielectric layer (e.g., the gate dielectric layer 202 of FIG. 2), wherein the readout gate insulator layer 302 extends continuously from the source/drain region 124e, along a sidewall of a junction isolation structure 118c, to the source/drain region 124f. In some embodiments, the source/drain regions 124e-f and the junction isolation structure 118c are respectively disposed along a sidewall 122csw of the third readout gate electrode 122c.

The junction isolation structure 118c continuously extends from the source/drain region 124e to the source/drain region 124f, comprises the first doping type (e.g., p-type), and/or has a doping concentration within a range of about $10^{17}$ to $10^{19}$ atoms/cm$^3$. In some embodiments, a high doping concentration of the junction isolation structure 118c may impede and/or prevent a conductive channel from forming under a portion of the third readout gate electrode 122c in which the junction isolation structure 118c lies. As such, the conductive channel forms first around the junction isolation structure 118c. The source/drain regions 124e-f each comprise the second doping type (e.g., n-type) and/or have a doping concentration within a range of about $10^{17}$ to $10^{19}$ atoms/cm$^3$. In some embodiments, the junction isolation structure 118c and the source/drain regions 124e-f have approximately a same doping concentration (e.g., within a range of about $10^{17}$ to $10^{19}$ atoms/cm$^3$). The junction isolation structure 118c is configured to electrically isolate the source/drain regions 124e-f from one another. In some embodiments, when proper bias conditions are applied to the third readout gate electrode 122c, a conductive channel 304 may be formed in the substrate 102 underlying the third readout gate electrode 122c. In such embodiments, formation of the conductive channel 304 facilitates the flow of charge carriers (e.g., electrons) from the source/drain region 124e to the source/drain region 124f, or vice versa. In some embodiments, an effective length of the conductive channel 304 is illustrated by the dashed line in FIG. 3B. As the effective length of the conductive channel 304 increases, the noise performance of the third readout transistor 120c increases.

The junction isolation structure 118c has a width w1 defined between the source/drain regions 124e-f, wherein the width w1 is, for example, within a range of about 50 to 500 nanometers. In some embodiments, if the width w1 is less than 50 nanometers, noise in the third readout transistor 120c may render it unusable. In further embodiments, if the width w1 is greater than 500 nanometers, then scaling of the image sensor is limited and costs associated with forming the third readout transistor 120c may be high. In some embodiments, the readout gate insulator layer 302 directly overlies the conductive channel 304. In such embodiments, a top view layout of the conductive channel 304 may correspond to the top view layout of the readout gate insulator layer 302, wherein the conductive channel 304 and the readout gate insulator layer 302 have a same area.

Figure 3C:
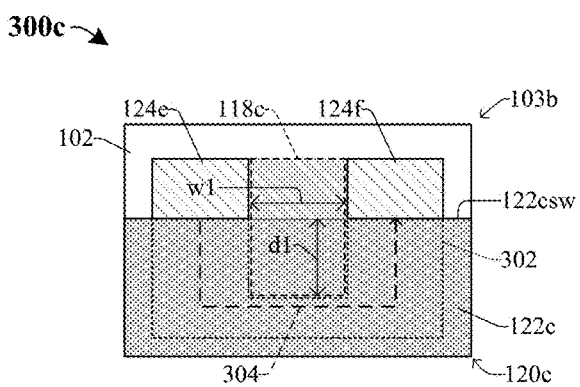

FIG. 3C illustrates a cross-sectional view of some alternative embodiments of a section of the image sensor 300a of FIG. 3A as indicated by the dashed box in FIG. 3A.

The junction isolation structure 118c extends under the third readout gate electrode 122c by a distance d1 to a point laterally offset from the sidewall 122csw of the third readout gate electrode 122c. The readout gate insulator layer 302 continuously extends around a perimeter of the junction isolation structure 118c that underlies the third readout gate electrode 122c. In some embodiments, the distance d1 is, for example, within a range of about 20 to 300 nanometers. In some embodiments, if the distance d1 is 20 nanometers or greater, then a noise performance of the third readout transistor 120c may be suitable for use at advanced process nodes. In further embodiments, if the distance d1 is greater than 300 nanometers, then scaling of the image sensor is limited and/or cost associated with forming the third readout transistor 120c may be high.

FIG. 4 illustrates a layout view of some embodiments of an image sensor 400 according to some alternative embodiments of the image sensor 100 of FIG. 1.

The image sensor 400 includes a first pixel sensor 106 and a second pixel sensor 108. The image sensor 400 further includes a second plurality of readout transistors 405a-b that correspond to a third pixel sensor 402. In some embodiments, the third pixel sensor 402 has a same layout of photodetectors, transfer transistors, and/or readout transistors as the first pixel sensor 106 (not shown). However, for ease of illustration, the photodetectors, transfer transistors, and a portion of the readout transistors of the third pixel sensor 402 have been omitted from FIG. 4. In some embodiments, the substrate 102 comprises any type of semiconductor body (e.g., monocrystalline silicon/CMOS bulk, silicon-germanium (SiGe), silicon on insulator (SOI), etc.) with a first doping type (e.g., p-type).

The first pixel sensor 106 includes a first plurality of photodetectors 106a-d, a first plurality of transfer transistors 112a-d, a first plurality of pickup well contact regions 114a-d, and a first plurality of floating diffusion nodes 116a-d. The first plurality of photodetectors 106a-d may comprise a second doping type (e.g., n-type) opposite the first doping type. The first plurality of pickup well contact regions 114a-d may comprise the first doping type (e.g., p-type) with a higher doping concentration than the substrate 102. The first plurality of floating diffusion nodes 116a-d may comprise the second doping type (e.g., n-type) with a higher doping concentration than the substrate 102. The first plurality of transfer transistors 112a-d are disposed over/in the substrate 102 and respectively over a photodetector in the first plurality of photodetectors 106a-d. For example, a first transfer transistor 112a overlies a first photodetector 106a (when viewed in cross section) and a second transfer transistor 112b overlies a second photodetector 106b.

In some embodiments, the first plurality of transfer transistors 112a-d are respectively configured to form a conductive channel between a corresponding photodetector and a corresponding floating diffusion node, such that charge accumulated (e.g., via absorbing incident radiation) in the corresponding photodetector may be transferred to the corresponding floating diffusion node. For example, the first transfer transistor 112a is configured to form a conductive channel between the first photodetector 106a and a first floating diffusion node 116a, wherein charge accumulated in the first photodetector 106a may be transferred to the first floating diffusion node 116a. In some embodiments, each transfer transistor in the first plurality of transfer transistors 112a-d may comprise a transfer gate electrode 109 that has an embedded conductive body 111 extending into the substrate 102. Further, at least a portion of the transfer gate electrodes 109 are respectively separated from the substrate 102 by a gate dielectric layer.

The second plurality of readout transistors 405a-b (e.g., a reset transistor, source-follower transistor, row-select transistor, etc.) is disposed on the substrate 102. In some embodiments, the second plurality of readout transistors 405a-b respectively comprise readout gate electrodes 406a-b, and source/drain regions 410. In some embodiments, the second plurality of readout transistors 405a-b may respectively be, for example, a metal-oxide semiconductor field-effect transistor (MOSFET) or the like. In further embodiments, the second plurality of readout transistors 405a-b respectively overlie the photodetectors 106c-d in the first plurality of photodetectors 106a-d.

A second plurality of junction isolation structures 407a-b is laterally disposed between the second plurality of readout transistors 405a-b and an adjacent transfer gate from the first plurality of transfer transistors 112a-d. The second plurality of junction isolation structures 407a-b are configured to increase isolation between the source/drain regions 410 of the second plurality of readout transistors 405a-b. In some embodiments, the second plurality of junction isolation structures 407a-b and the second plurality of readout transistors 405a-b are respectively configured as the third readout transistor 120c of FIG. 3B or 3C. In such embodiments, a readout gate insulator layer 302 is disposed between the substrate 102 and each readout gate electrode 406a-b. Further, when viewed in cross-section, the second plurality of junction isolation structures 407a-b respectively extend beneath a respective readout gate electrode 406a-b. Thus, an effective length of a conductive channel formed beneath each readout gate electrode 406a-b may be increased (as described in FIG. 3B or 3C). This increases a noise performance of the second plurality of readout transistors 405a-b, thereby reducing noise (e.g., flicker noise) in the image sensor 400.

Further, as illustrated in FIG. 4, the first plurality of readout transistors 120a-c are each configured as the third readout transistor 120c of FIG. 3C. In such embodiments, the first plurality of readout transistors 120a-c respectively comprise the readout gate insulator layer 302 disposed between the substrate 102 and a corresponding readout gate electrode 122a-c. Thus, an effective length of a conductive channel formed in the substrate 102 beneath each readout gate electrode 122a-c may be increased, thereby increasing a noise performance of readout transistor 120a-c. This further reduces noise in the image sensor 400.

Additionally, in some embodiments, a first conductive via 130a of the conductive vias 130 directly overlies and/or is electrically coupled to a second pickup well contact region 114b of the first plurality of pickup well contact regions 114a-d. The first conductive via 130a may be configured as a substrate contact node or a ground node and/or may be referred to as a ground via or a substrate contact via. In some embodiments, the first conductive via 130a may be electrically coupled to ground, wherein a pixel well region (not shown) disposed beneath the second pickup well contact region 114b and along an adjacent sidewall of the second photodetector 106b is electrically coupled to ground. Further, a second conductive via 130b of the conductive vias 130 directly overlies and/or is electrically coupled to a source/drain region 124f of the third readout transistor 120c. In such embodiments, the second conductive via 130b is electrically coupled to a power supply (e.g., a direct current (DC) power supply), such that the second conductive via 130b is configured as a power supply via and/or a power supply node. In some embodiments, the first conductive via 130a is the nearest or closest conductive via in to the second conductive via 130b. In other embodiments, a distance between the first conductive via 130a and the second conductive via 130b is less than a distance between the first conductive via 130a and any other conductive via in the plurality of conductive vias 130. This, in part, may reduce a number of conductive vias 130 and/or conductive wires disposed over the substrate 102, thereby decreasing a time and costs associated with forming the image sensor 400.

FIG. 5 illustrates a cross-sectional view 500 of some alternative embodiments of the image sensor 400 of FIG. 4, according to the line B-B'.

The substrate 102 has a front-side 102f opposite a back-side 102b. The second isolation structure 131 extends from above the front-side 102f to a point in the substrate 102 below the front-side 102f. The first isolation structure 110 extends from the back-side 102b to the point in the substrate 102, wherein a top surface of the first isolation structure 110 directly contacts and/or is aligned with a bottom surface of the second isolation structure 131. In such embodiments, the first and second isolation structures 110, 131 may form a full depth deep trench isolation (DTI) structure that extends completely through the substrate 102. This, in part, may increase a well capacity of the image sensor 100. The third readout transistor 120c continuously extends over a segment 110a of the first isolation structure 110 that is laterally between the second photodetector 106b of the first plurality of photodetectors 106a-b and the second photodetector 108b of the second plurality of photodetectors 108a-b. A readout transistor 405b of the second plurality of readout transistors 405a-b continuously extends over another segment 110b of the first isolation structure 110. The another segment 110b of the first isolation structure 110 is laterally offset from the segment 110a by a non-zero distance. In such embodiments, the readout transistor 405b of the second plurality of readout transistors 405a-b continuously extends from over a photodetector 106d of the first pixel sensor 106 to a photodetector (not shown) of the third pixel sensor 402. Therefore, in some embodiments, the image sensor 400 comprises more than one transistor (e.g., readout transistors 405b and 120c) that continuously and completely extends over a segment of the first isolation structure 110. In such embodiments, the segment of the first isolation structure 110 is sandwiched between two pixel sensors.

In some embodiments, an anti-reflection layer 502 extends along the back-side 102b of the substrate 102. In some embodiments, the anti-reflection layer 502 is configured to reduce the amount of incident radiation reflected by the substrate 102. In further embodiments, the anti-reflection layer 502 may, for example, be or comprise an oxide, a high-k dielectric, a nitride, or the like. In further embodiments, the anti-reflection layer 502 may include a first layer comprising an oxide stacked on a second layer comprising a high-k dielectric, or vice versa.

A plurality of color filters 504 (e.g., a red color filter, a blue color filter, a green color filter, etc.) directly contact the anti-reflection layer 502. In some embodiments, the color filters 504 are arranged in an array underlying the anti-reflection layer 502. The color filters 504 are respectively configured to transmit specific wavelengths of incident radiation. For example, a first color filter (e.g., the red color filter) may transmit light having wavelengths within a first range, while a second color filter (e.g., the blue color filter) may transmit light having wavelengths within a second range different than the first range. Further, a plurality of micro-lenses 506 are disposed under the color filters 504. The micro-lenses 506 are configured to focus incident radiation (e.g., photons) towards the overlying photodetectors (e.g., the first plurality of photodetectors 106a-d of FIG. 4).

Figure 6:
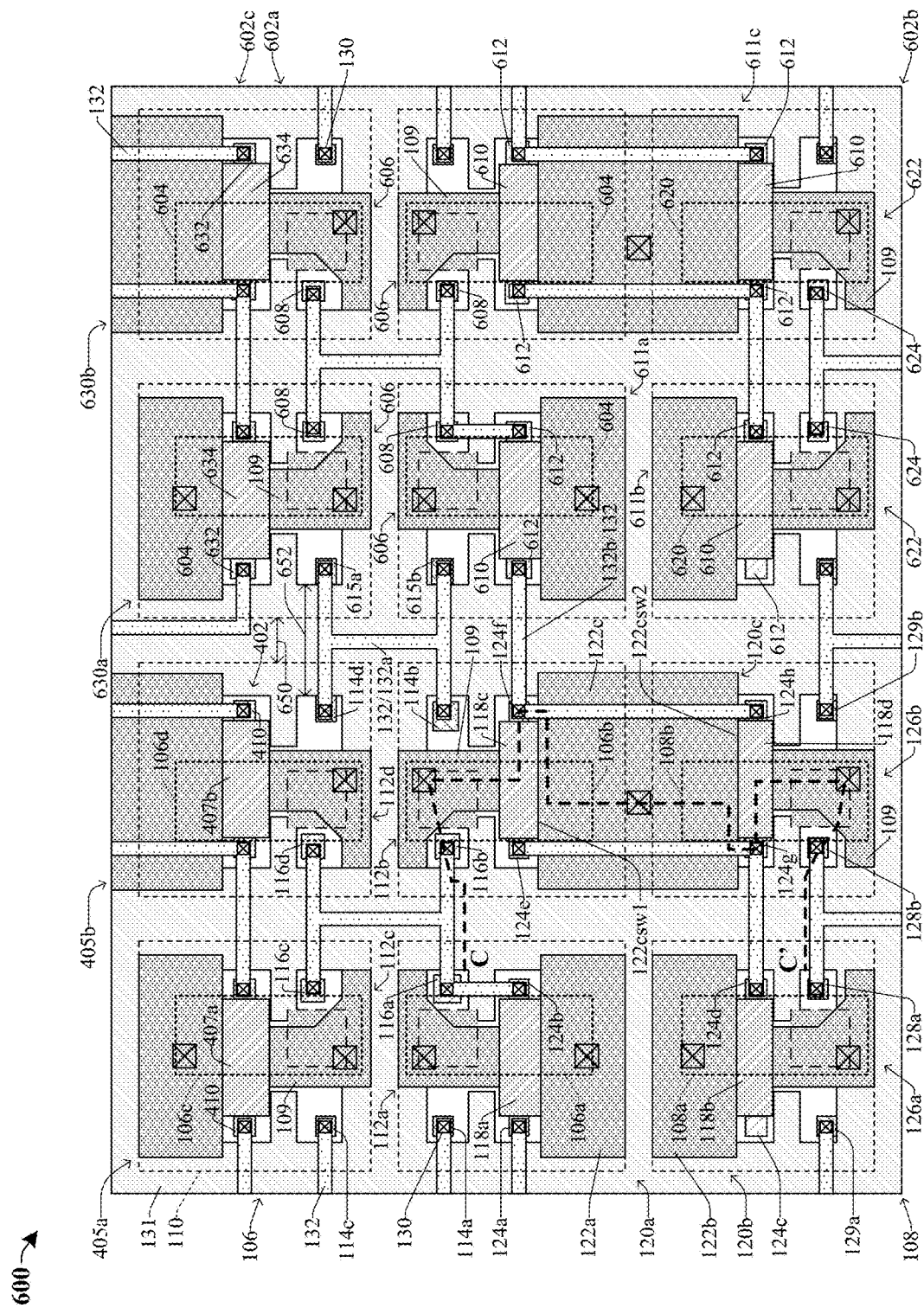
FIG. 6 illustrates a layout view of an image sensor according to alternative embodiments of the image sensor of FIG. 4, where the image sensor has more than one pixel device that each extend over an isolation structure.

FIG. 6 illustrates a layout view of some embodiments of an image sensor 600 corresponding to alternative embodiments of the image sensor 400 of FIG. 4.

The image sensor 600 includes the first pixel sensor 106, the second pixel sensor 108, the third pixel sensor 402, a fourth pixel sensor 602a, a fifth pixel sensor 602b, and a sixth pixel sensor 602c. In some embodiments, the image sensor 600 includes an array of pixel sensors, wherein the image sensor 400 of FIG. 4 is disposed adjacent to another image sensor configured as the image sensor 400. In such embodiments, the fourth pixel sensor 602a is configured as the first pixel sensor 106 of FIG. 4, the fifth pixel sensor 602b is configured as the second pixel sensor 108 of FIG. 4, and the sixth pixel sensor 602c is configured as the third pixel sensor 402 of FIG. 4.

The fourth pixel sensor 602a includes a fourth plurality of photodetectors 604, a fourth plurality of transfer transistors 606, a fourth plurality of floating diffusion nodes 608, a fourth plurality of junction isolation structures 610, source/drain regions 612, and a third plurality of readout transistors 611a-c. In some embodiments, the aforementioned regions, devices, and/or structures of the fourth pixel sensor 602a are configured as a corresponding region, device, and/or structure of the first pixel sensor 106, as illustrated and/or described in FIGS. 1, 2, 3A-C, 4, and/or 5. The fifth pixel sensor 602b includes a fifth plurality of photodetectors 620, a fifth plurality of transfer transistors 622, and a fifth plurality of floating diffusion nodes 624. In some embodiments, the aforementioned regions, devices, and/or structures of the fifth pixel sensor 602b are configured as a corresponding region, device, and/or structure of the second pixel sensor 108, as illustrated and/or described in FIGS. 1, 2, 3A, 4, and/or 5. Further, the sixth pixel sensor 602c includes a third plurality of readout transistors 630a-b, source/drain regions 632, and a plurality of junction isolation structures 634. In some embodiments, the aforementioned regions, devices, and/or structures of the sixth pixel sensor 602c are configured as a corresponding region, device, and/or structure of the third pixel sensor 402, as illustrated and/or described in FIG. 4.

As illustrated in FIG. 6, a third readout transistor 611c of the third plurality of readout transistors 611a-c laterally extends from over a photodetector 604 of the fourth pixel sensor 602a, continuously across the first and second isolation structures 110, 131, to over a photodetector 620 of the fifth pixel sensor 602b. Thus, a noise performance of the fourth pixel sensor 602a may be increased. Further, a width 650 of the first isolation structure 110 between the first and fourth pixel sensors 106, 602a is less than a width 652 of the second isolation structure 131 between the first and fourth pixel sensors 106, 602a.

A second pickup well contact region 114b and a fourth pickup well contact region 114d of the first pixel sensor 106 each directly overlie and/or are directly electrically coupled to an underlying pixel well region (not shown). The pixel well region is a doped region of the substrate 102 comprising the first doping type (e.g., p-type) and extends along a sidewall of an adjacent photodetector. For example, a pixel well region underlies the second pickup well contact region 114b and extends along a sidewall of the second photodetector 106b. In some embodiments, a pixel well region comprising the first doping type underlies each pickup well contact region (e.g., pickup well contact regions 114a-d, 129a-b) of the pixel sensors 106, 108, 402, 602a-d and adjoins an adjacent photodetector. Pickup well contact regions 615a-b of the fourth pixel sensor 602a directly overlie and/or are directly electrically coupled to a pixel well region (not shown) disposed along an adjacent photodetector in the fourth plurality of photodetectors 604. The pickup well contact regions 114b, 114d, 615a-b are electrically coupled to an overlying first conductive wire 132a by way of the conductive vias 130. By connecting the pickup well contact regions 114b, 114d, 615a-b to a single conductive wire (e.g., the first conductive wire 132a), a number of conductive wires 132 disposed over the substrate 102 is decreased, thereby decreasing the total conductive density of the interconnect structure and costs associated with forming the image sensor 600.

A second conductive wire 132b extends over source/drain regions 124f, 124h of the third readout transistor 120c and is electrically coupled to the source/drain regions 124f, 124h by underlying conductive vias 130. The second conductive wire 132b continuously extends over the first isolation structure 110 to a source/drain region 612 of a first readout transistor 611a of the fourth pixel sensor 602a. The second conductive wire 132b is directly electrically coupled to the source/drain region 612 of the first readout transistor 611a. Thus, the source/drain regions 124f, 124h of the third readout transistor 120c and the source/drain region 612 of the first readout transistor 611a are directly electrically coupled together, thereby increasing a noise performance of the image sensor 600. Further, this may reduce a number of conductive wires 132 and/or conductive vias 130 disposed over the substrate 102, thereby decreasing the total conductive density of the interconnect structure and costs associated with forming the image sensor 600.

Figure 7:
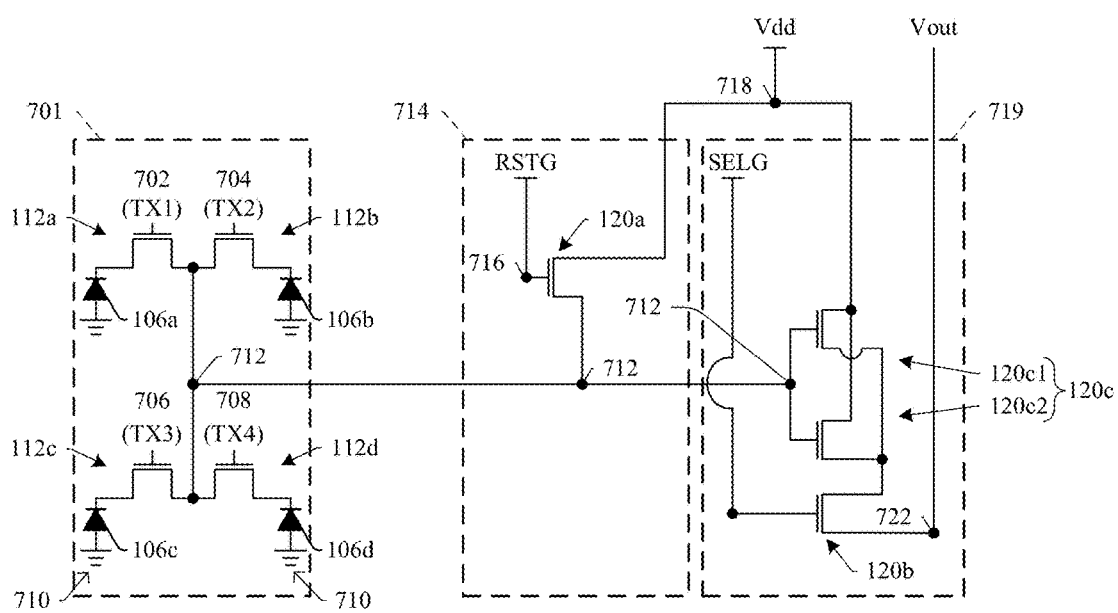
FIG. 7 illustrates a circuit diagram of some alternative embodiments of the image sensor of FIG. 4.

FIG. 7 illustrates a circuit diagram 700 corresponding to some embodiments of a circuit representation of the first pixel sensor 106 of FIG. 4 or FIG. 6.

The circuit diagram 700 represents some embodiments of receiving and processing incident electromagnetic radiation disposed upon the first plurality of photodetectors 106a-d. A charge collection circuit 701 includes the first plurality of photodetectors 106a-d respectively electrically coupled to a first node 712 through the first plurality of transfer transistors 112a-d. The charge collection circuit 701 is configured to transfer/remove charge collected from the incident electromagnetic radiation within the first plurality of photodetectors 106a-d to the first node 712. For example, the first plurality of transfer transistors 112a-d are configured to respectively remove/transfer charge collected from the incident electromagnetic radiation within each photodetector in the first plurality of photodetectors 106a-d to a respective floating diffusion node (e.g., the first plurality of floating diffusion nodes 116a-d of FIG. 4). Transfer voltages are applied to TX1 node 702, TX2 node 704, TX3 node 706, and TX4 node 708 to electrically couple the first plurality of photodetectors 106a-d respectively to the first plurality of floating diffusion nodes (116a-d of FIG. 4). The aforementioned nodes are respectively electrically coupled to the transfer gate electrodes (109 of FIG. 4) of the first plurality of transfer transistors 112a-d. In some embodiments, a first source/drain region of each transfer transistor 112a-d is electrically coupled to a ground node 710 (e.g., the ground node 710 is electrically coupled to ground) through a respective photodetector 106a-d and a second source/drain region of each transfer transistor 112a-d is electrically coupled to the first node 712. In the aforementioned embodiment, the first plurality of transfer transistors 112a-d are electrically coupled in parallel with one another. The first node 712 is electrically coupled to the first plurality of floating diffusion nodes (116a-d of FIG. 4), a first source/drain region of the first readout transistor 120a (e.g., a reset transistor), and a readout gate electrode of the third readout transistor 120c (e.g., a source-follower transistor). In some embodiments, the ground node 710 is electrically coupled to each conductive via 130 directly overlying and/or directly electrically couple to the first plurality of pickup well contact regions 114a-d of FIG. 4 or 6.

A pre-charge circuit 714 includes the first readout transistor 120a (e.g., a reset transistor). The pre-charge circuit 714 is electrically coupled to an output terminal (e.g., the first node 712) of the charge collection circuit 701. The pre-charge circuit 714 is configured to set the first node 712 to an initial charge state (e.g., to a first voltage value, such as 5 volts (V)). During operation of the circuit 700, a voltage at the first node 712 may be set to and/or may fluctuate from the initial charge state, and the pre-charge circuit 714 may be used to set the voltage at the first node 712 back to the initial charge state. In some embodiments, the first source/drain region of the first readout transistor 120a is electrically coupled to the first node 712, and a second source/drain region of the first readout transistor 120a is electrically coupled to a power supply node 718. In some embodiments, the power supply node 718 is electrically coupled to a power supply (e.g., a direct current (DC) power supply) that supplies a voltage Vdd. In further embodiments, a reset gate voltage RSTG is applied to the first readout gate electrode (122a of FIG. 4) of the first readout transistor 120a to apply the voltage Vdd at the power supply node 718 to the first node 712.

A charge transfer circuit 719 includes the third readout transistor 120c (e.g., a source-follower transistor) and the second readout transistor 120b (e.g., a row-select transistor) electrically coupled to one another. An input terminal of the charge transfer circuit 719 is electrically coupled to an output terminal (e.g., the first node 712) of the pre-charge circuit 714. An output terminal of the charge transfer circuit 719 is electrically coupled to an output node 722 (e.g., Vout or a word line). During operation of the circuit 700, if a charge level at the first node 712 is sufficiently high, the charge transfer circuit 719 is configured to selectively output charge to the output node 722 according to the second readout transistor 120b. In some embodiments, a first source/drain region of the third readout transistor 120c is electrically coupled to the power supply node 718. A second source/drain region of the third readout transistor 120c is electrically coupled to a first source/drain region of the second readout transistor 120b. A second source/drain region of the second readout transistor 120b is electrically coupled to the output node 722. A select gate voltage SELG is applied to a gate electrode of the second readout transistor 120b. The select gate voltage SELG is configured to control the output of charge to the output node 722.

In some embodiments, as seen in FIG. 7, the third readout transistor 120c may include two transistors 120c1-2 electrically coupled in parallel with one another. In such embodiments, this may be achieved because the third readout gate electrode (122c of FIG. 4) continuously extends over a segment of the first isolation structure (110 of FIG. 4). In the layout view of FIG. 4, a first transistor 120c1 may overlie the second photodetector 106b of the first plurality of photodetectors 106a-d, and a second transistor 120c2 may overlie a photodetector (108b of FIG. 4) of the second plurality of photodetectors 108a-b. Further, a segment of the first isolation structure (110 of FIG. 4) is laterally between source/drain regions of the first and second transistors 120c1-2. By virtue of the third readout transistor 120c comprising two transistors 120c1-2 electrically coupled in parallel with one another, an effective length of the conductive channel formed in the substrate (102 of FIG. 4) beneath the third readout gate electrode (122c of FIG. 4) may be increased. This will increase a noise performance of the image sensor 400 of FIG. 4.

Further, the two transistors 120c1-2 share a gate electrode (e.g., the third readout gate electrode (122c of FIG. 4)). This omits at least a conductive wire and conductive via that may otherwise be utilized to electrically couple two separate gate electrodes together, thereby decreasing the total conductive density of the interconnect structure (e.g., the conductive vias and wires 130, 132) of FIG. 4. Because the total conductive density of the interconnect structure is decreased, a noise performance of the image sensor 400 is further increased.

In some embodiments, during operation of the circuit 700, if a charge level is sufficiently high within the first plurality of photodetectors 106a-d while a respective transfer transistor 112a-d is activated, the third readout transistor 120c is activated and charges are selectively output according to operation of the second readout transistor 120b used for addressing. The first readout transistor 120a may be used to reset (e.g., set to an initial voltage, such as 5 volts) the photodetectors 106a-d between exposure periods of the incident radiation.

Figure 8:
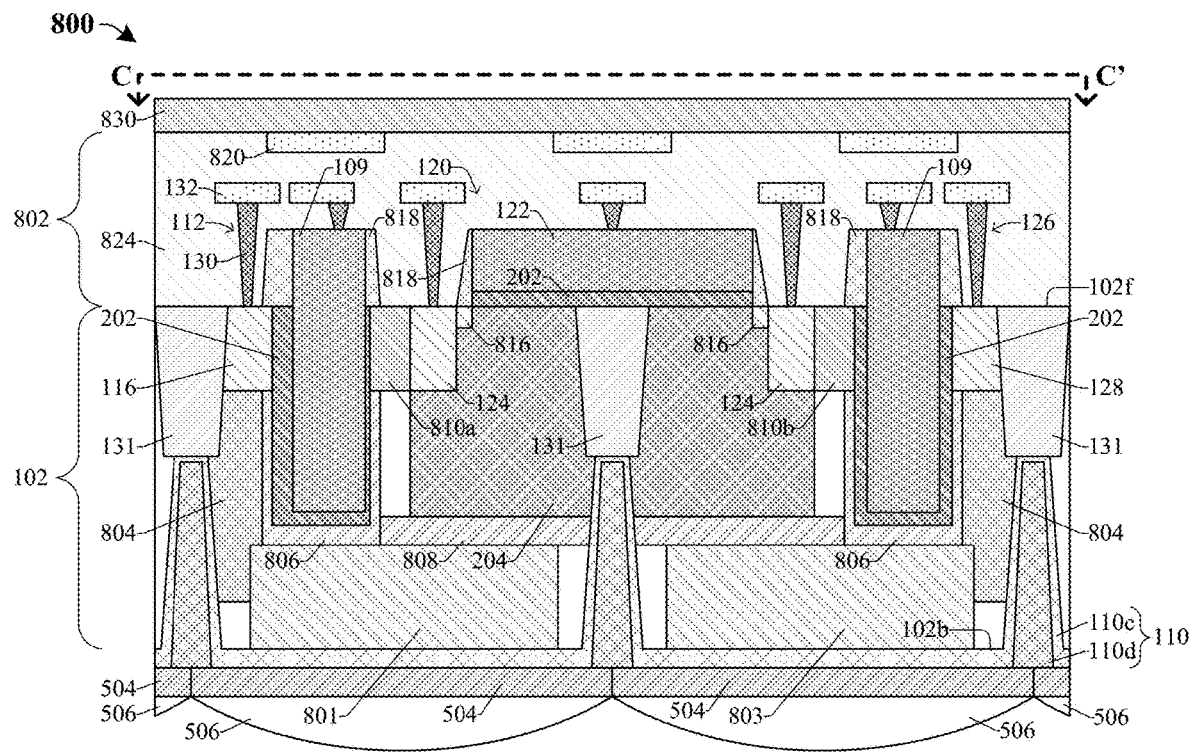
FIGS. 8 and 9 illustrate cross-sectional views of some alternative embodiments of the image sensor of FIG. 6, according to the line C-C'.

FIG. 8 illustrates a cross-sectional view of an image sensor 800 according to some embodiments of the image sensor 600 of FIG. 6, according to the line C-C'.

The image sensor 800 includes an interconnect structure 802 overlying a front-side 102f of a substrate 102. The substrate 102 may, for example, be a bulk silicon substrate comprising a first doping type (e.g., p-type). The image sensor 800 further includes a readout transistor 120 disposed between a first transfer transistor 112 and a second transfer transistor 126. The first transfer transistor 112 overlies a first photodetector 801, and the second transfer transistor 126 overlies a second photodetector 803. The first and second photodetectors 801, 803 respectively comprise the second doping type (e.g., n-type). In some embodiments, the image sensor 800 comprises a plurality of pixel sensors disposed in an array of columns and rows. The pixel sensors respectively comprise transfer transistors, readout transistors, and photodetectors. For example, the first transfer transistor 112, the first photodetector 801, and the readout transistor 120 may respectively be a part of a first pixel sensor, and the second transfer transistor 126 and the second photodetector 803 may respectively be a part of a second pixel sensor. Thus, the readout transistor 120 continuously extends over a first isolation structure 110 from above the first pixel sensor to above the second pixel sensor.

In some embodiments, the readout transistor 120 may be configured as the third readout transistor 120c is illustrated and/or described in FIG. 1, 2, 3A-C, 4, 5, or 6. The first photodetector 801 may be configured as the second photodetector 106b of the first pixel sensor 106 is illustrated and/or described in FIG. 1, 2, 3A, 4, 5, or 6. The second photodetector 803 may be configured as the second photodetector 108b of the second pixel sensor 108 is illustrated and/or described in FIG. 1, 2, 3A, 4, 5, or 6.

The interconnect structure 802 includes an interconnect dielectric structure 824, a plurality of conductive vias 130, a plurality of conductive wires 132, and conductive bond pads 820. The interconnect structure 802 is configured to electrically coupled doped regions of the substrate 102, devices, and/or structures together. In further embodiments, the interconnect structure 802 may be bonded to and/or electrically coupled to another integrated circuit (IC) die 830 (e.g., an integrated circuit (IC) die comprising one or more semiconductor devices, or a carrier substrate). In some embodiments, the another IC die 830 may, for example, be an application-specific integrated circuit (ASIC). In some embodiments, the another IC die 830 may, for example, comprise transistors, power MOSFET devices, dynamic random-access memory (DRAM) devices, a combination of the foregoing, or the like.

A second isolation structure 131 extends into the front-side 102f of the substrate 102 and contacts the first isolation structure 110. The first isolation structure 110 includes a first isolation layer 110c and a second isolation layer 110d. The first isolation layer 110c extends from the back-side 102b of the substrate 102 to the second isolation structure 131, and may be configured as the anti-reflection layer 502 of FIG. 5. The first isolation structure 110 and the second isolation structure 131 are configured to electrically isolate adjacent semiconductor devices disposed within/on the substrate 102 from one another. For example, the first photodetector 801 is electrically isolated from the second photodetector 803 by the first and second isolation structures 110, 131. In some embodiments, the first and second isolation structures 110, 131 are referred to as a full depth deep trench isolation (DTI) structure. A plurality of color filters 504 is disposed along the first isolation structure 110, and a plurality of microlenses 506 is disposed along the plurality of color filters 504.

In some embodiment, an isolation region 808 is disposed along an upper surface of the first and second photodetectors 801, 803. The isolation region 808 may be a doped region of the substrate 102 configured to increase electrical isolation between the first and second photodetectors 801, 803 and overlying semiconductor devices and/or doped regions (such as the readout transistor well region 204). The isolation region 808 comprises the first doping type (p-type). Transfer transistor well regions 804 are respectively disposed between the first and second transfer transistors 112, 126 and the first and second isolation structures 110, 131. The transfer transistor well regions 804 comprise the first doping type (e.g., p-type).

The first and second transfer transistors 112, 126 respectively comprise a transfer gate electrode 109, a gate dielectric layer 202, a lower gate implant region 806, and a sidewall spacer structure 818. The lower gate implant region 806 has the first doping type (e.g., p-type) and is configured to improve an interface between the gate dielectric layer 202 and the substrate 102, thereby decreasing dark current in the first and second transfer transistors 112, 126. This, in part, may increase a noise performance of the image sensor 800. Further, a first floating diffusion node 116 and a second floating diffusion node 128 are respectively disposed along a sidewall of the first and second transfer transistors 112, 126. The first and second floating diffusion nodes 116, 128 respectively comprise the second doping type (e.g., n-type).

The readout transistor 120 is disposed laterally between the first and second transfer transistors 112, 126. The readout transistor 120 includes a readout gate electrode 122, a sidewall spacer structure 818, a gate dielectric layer 202, source/drain regions 812, 814, lightly doped regions 816, and the readout transistor well region 204. In some embodiments, the readout transistor 120 is configured to facilitate readout of an electrical signal from the first photodetector 801. In such embodiments, the readout transistor 120 may not conduct readout of an electrical signal from the second photodetector 803, such that the first photodetector 801 is a part of a first pixel sensor and the second photodetector 803 is a part of a second pixel sensor separate from the first pixel sensor.

Figure 9:
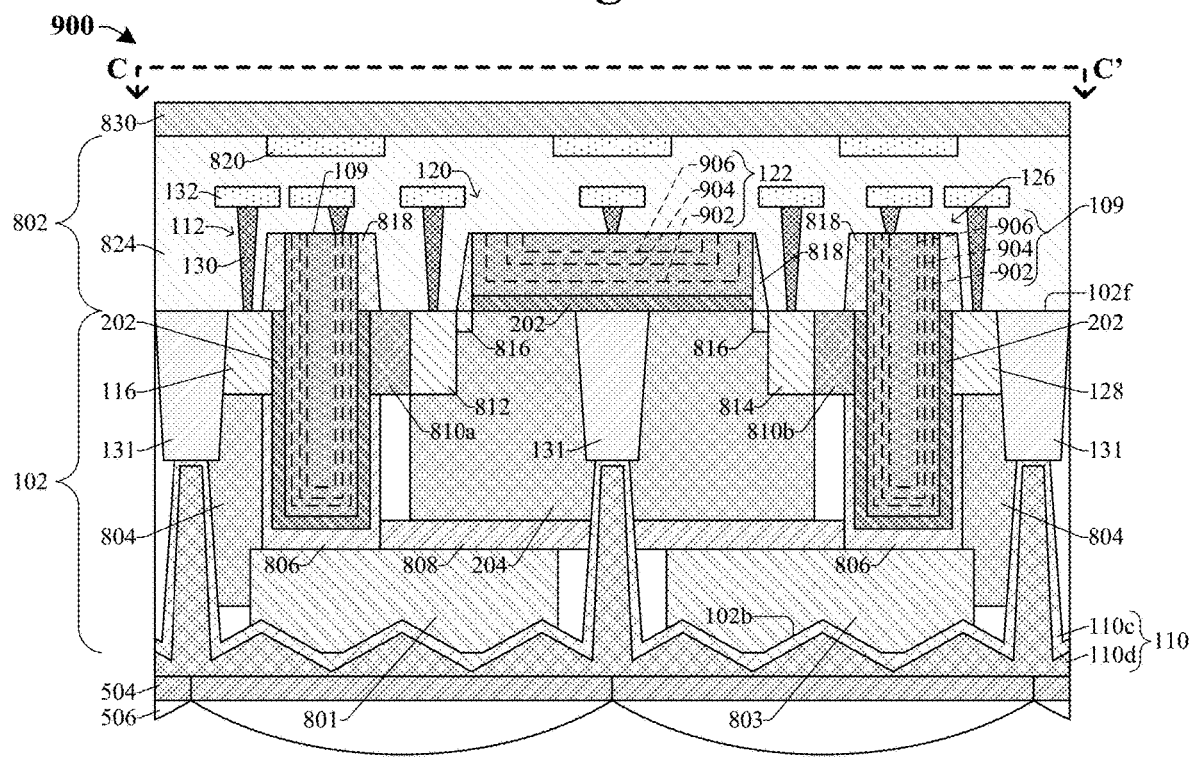

FIG. 9 illustrates a cross-sectional view of an image sensor 900 according to some alternative embodiments of the image sensor 800 of FIG. 8.

The first isolation layer 110c of the first isolation structure 110 may, for example, have a non-flat pattern (e.g., a jig-saw pattern) configured to increase a light receiving surface area for incident radiation disposed upon the first and second photodetectors 801, 803. This, in part, increases a sensitivity and/or quantum efficiency (QE) of the image sensor 900.

Further, as illustrated in FIG. 9, the readout gate electrode 122 and/or the transfer gate electrodes 109 may each comprise a plurality of gate electrode layers 902, 904, 906. In such embodiments, the aforementioned electrodes may be configured as high-k metal gates, wherein the gate dielectric layer 202 comprises a high-k dielectric material. Further, the gate electrode layers 902, 904, 906 may respectively, for example, be or comprise titanium nitride, tantalum nitride, titanium, tantalum, tungsten, aluminum, or the like.

FIGS. 10-17 illustrate cross-sectional views 1000-1700 of some embodiments of a method of forming an image sensor according to aspects of the present disclosure. Although the cross-sectional views 1000-1700 shown in FIGS. 10-17 are described with reference to a method, it will be appreciated that the structures shown in FIGS. 10-17 are not limited to the method but rather may stand alone separate of the method. Although FIGS. 10-17 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part. In some embodiments, FIGS. 10-17 may, for example, be employed to form the image sensor 800 of FIG. 8. In such embodiments, a layout of the regions, structures, and/or devices in FIGS. 10-17 may correspond to the layout illustrated in FIG. 6, according to the line C-C'.

Figure 10:
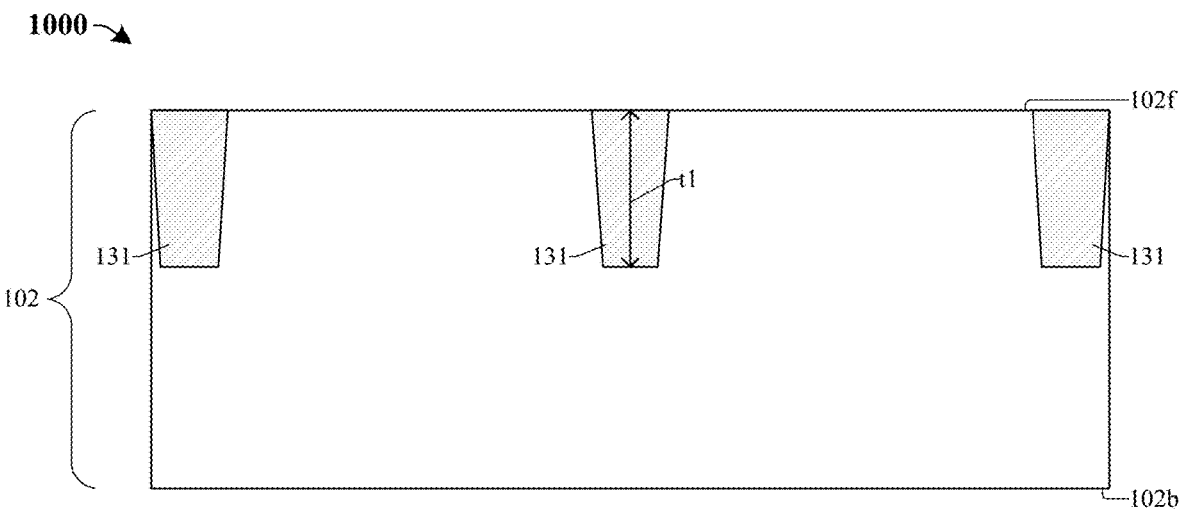
FIGS. 10-17 illustrate a series of cross-sectional views of some embodiments of a method for forming an image sensor having a pixel device that extends over an isolation structure.

As shown in cross-sectional view 1000 of FIG. 10, a substrate 102 is provided and a second isolation structure 131 (in some embodiments, referred to as a shallow trench isolation (STI) structure) is formed on a front-side 102$f$ of the substrate 102. In some embodiments, the substrate 102 may, for example, be a bulk substrate (e.g., a bulk silicon substrate), a silicon-on-insulator (SOI) substrate, or some other suitable substrate. In some embodiments, before forming the second isolation structure 131, a first implant process is performed to dope the substrate 102 with a first doping type (e.g., p-type). In such embodiments, the substrate 102 may have a doping concentration, for example, within a range of about $10^{13}$ to $10^{16}$ atoms/cm$^3$. In some embodiments, a process for forming the second isolation structure 131 may include: 1) selectively etching the substrate 102 to form a trench in the substrate 102 that extends into the substrate 102 from the front-side 102$f$; and 2) filling (e.g., by chemical vapor deposition (CVD), physical vapor deposition (PVD), atomic layer deposition (ALD), thermal oxidation, etc.) the trench with a dielectric material. In some embodiments, the second isolation structure 131 may, for example, be or comprise silicon dioxide, a nitride, or another suitable dielectric material. In further embodiments, the second isolation structure 131 has a thickness t1 that is within a range of about 0.05 to 0.40 micrometers.

Figure 11:
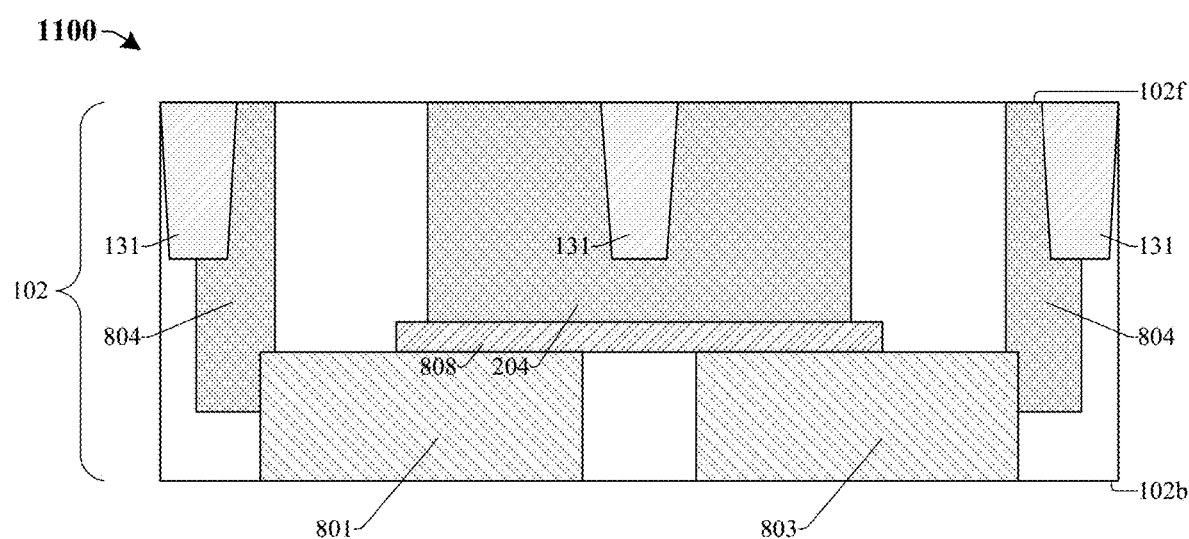

As shown in cross-sectional view 1100 of FIG. 11, a first photodetector 801 and a second photodetector 803 are formed in the substrate 102. The first and second photodetectors 801, 803 are each regions of the substrate 102 comprising a second doping type (e.g., n-type) opposite the first doping type (e.g., p-type). In some embodiments, the first and second photodetectors 801, 803 may be formed by a selective ion implantation process that utilizes a masking layer (not shown) on the front-side 102$f$ of the substrate 102 to selectively implant ions into the substrate 102. In some embodiments, the first and second photodetectors 801, 803 may each have a doping concentration within a range of about $10^{15}$ to $10^{18}$ atoms/cm$^3$. Further, the first and second photodetectors 801, 803 are each vertically offset from the second isolation structure 131 by a non-zero distance in a direction away from the front-side 102$f$ of the substrate 102. In some embodiments, with reference to FIG. 6, the first photodetector 801 may correspond to the second photodetector 106$b$ of the first pixel sensor 106 in FIG. 6, and the second photodetector 803 may correspond to the second photodetector 108$b$ of the second pixel sensor 108 in FIG. 6.

Also shown in FIG. 11, one or more doped regions are formed in the substrate 102. For example, an isolation region 808 is formed over the first and second photodetectors 801, 803. In some embodiments, the isolation region 808 comprises the first doping type (e.g., p-type) with a doping concentration within a range of about $10^{17}$ to $10^{19}$ atoms/cm$^3$. In further embodiments, during operation of the image sensor, a pn-junction is formed between the isolation region 808 and the first and second photodetectors 801, 803 and hence forms a depletion region. In such embodiments, at least a portion of the isolation region 808 is not depleted (e.g., a region vertically offset from the first or second photodetectors 801, 803), wherein the isolation region 808 is biased by a substrate contact via (not shown), such that pn-junction capacitance for the image sensor is increased. In some embodiments, the portion of the isolation region 808 is not depleted because of the biasing. In some embodiments, with reference to FIG. 6, the isolation region 808 may be biased by a conductive via 130 overlying a pickup well contact region 114$b$ of the first pixel sensor 106. In such embodiments, the isolation region 808 is electrically coupled to the pickup well contact region 114$b$. Further, transfer transistor well regions 804 are formed along an upper surface and sidewalls of the first and second photodetectors 801, 803, respectively. A readout transistor well region 204 is formed over the first and second photodetectors 801, 803 vertically between the transfer transistor well regions 804. In some embodiments, the transfer transistor well regions 804 and/or the readout transistor well region 204 respectively may, for example, comprise the first doping type (e.g., p-type) within a range of about $10^{16}$ to $10^{18}$ atoms/cm$^3$. In further embodiments, the transfer transistor well regions 804 and/or the readout transistor well region 204 may each have a lower doping concentration than the isolation region 808. In some embodiments, formation of the aforementioned one or more doped regions may include performing at least one selective ion implantation process that utilizes a masking layer (not shown) on the front-side 102$f$ of the substrate 102 to selectively implant ions into the substrate 102.

Figure 12:
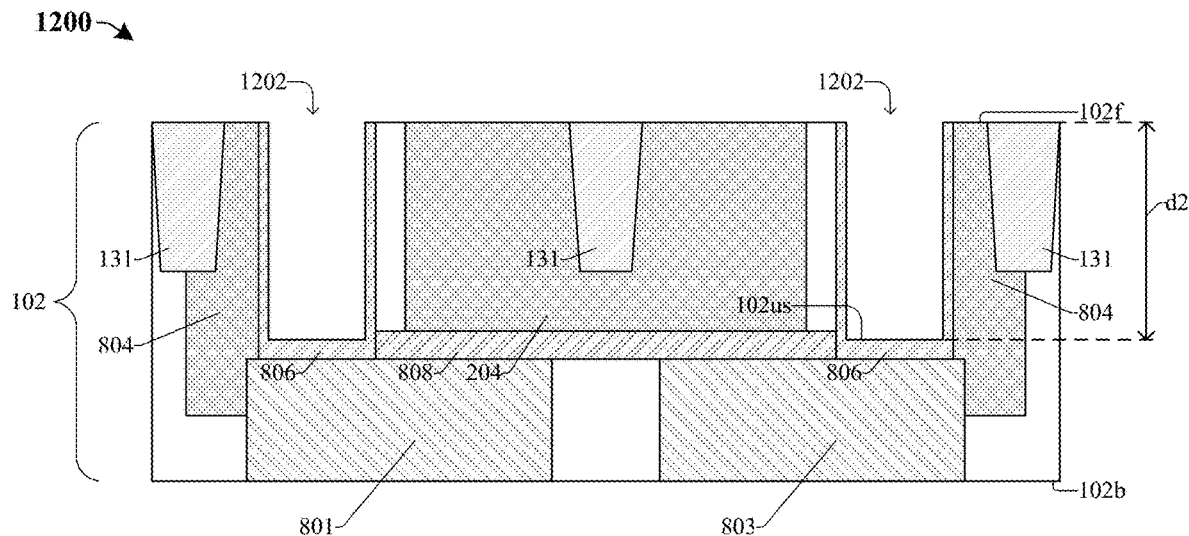

As shown in cross-sectional view 1200 of FIG. 12, the substrate 102 is patterned to form vertical gate electrode openings 1202. In some embodiments, the patterning process includes: 1) forming a masking layer (not shown) over the front-side 102$f$ of the substrate 102; 2) exposing unmasked regions of the substrate 102 to one or more etchants, thereby defining the vertical gate electrode openings 1202 and an upper surface 102$us$ of the substrate 102; and 3) performing a removal process to remove the masking layer. The upper surface 102$us$ of the substrate 102 is vertically offset from the front-side 102$f$ of the substrate 102 by a distance d2. In some embodiments, the distance d2 is within a range of about 0.1 to 0.6 micrometers. After forming the vertical gate electrode openings 1202, a lower gate implant region 806 having the first doping type (e.g., p-type) is formed in the substrate 102. In some embodiments, the lower gate implant region 806 has a doping concentration within a range of about $5*10^{16}$ to $5*10^{18}$ atoms/cm$^3$. In further embodiments, the lower gate implant region 806 is formed by performing a selective ion implant process according to a masking layer (not shown) disposed over the front-side 102f of the substrate 102.

Figure 13:
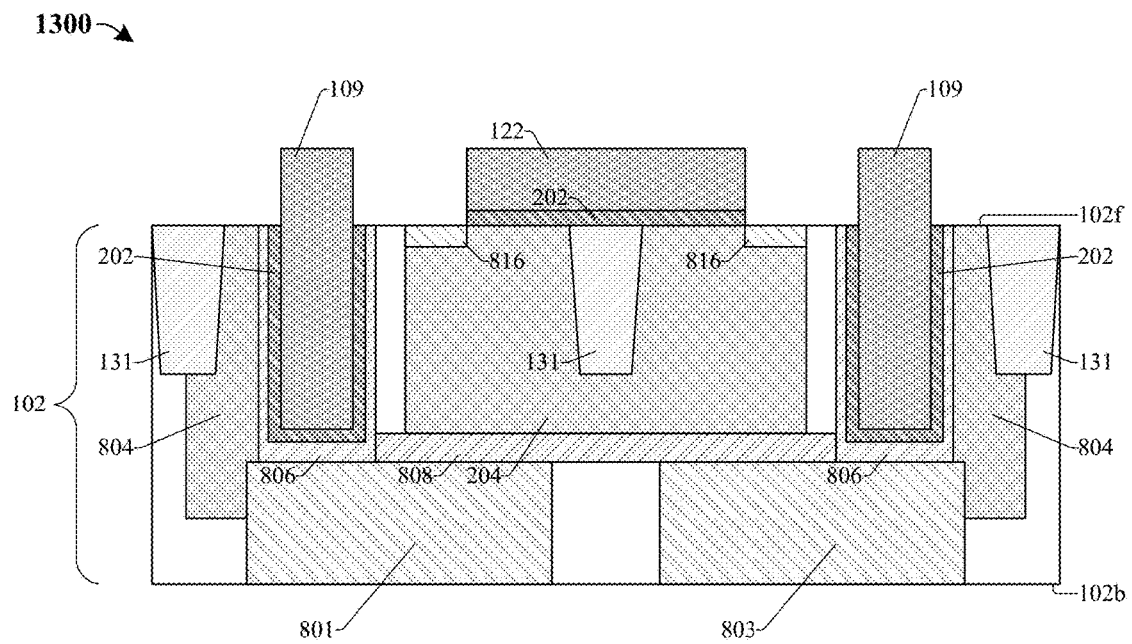

As shown in cross-sectional view 1300 of FIG. 13, a gate dielectric layer 202 is formed over the substrate 102. The gate dielectric layer 202 at least partially lines the vertical gate electrode openings (1202 of FIG. 12) and overlies at least a portion of the front-side 102f of the substrate 102 directly above the readout transistor well region 204. Further, a transfer gate electrodes 109 are formed in the vertical gate electrode openings (1202 of FIG. 12) and a readout gate electrode 122 is formed over the readout transistor well region 204. In some embodiments, the aforementioned layers and/or structures are formed by 1) depositing a gate dielectric film over the substrate 102; 2) subsequently depositing a gate electrode layer of the gate dielectric film; and 3) patterning the gate dielectric film and the gate electrode layer according to a masking layer (not shown), thereby defining the gate dielectric layer 202, the transfer gate electrodes 109, and the readout gate electrode 122. In some embodiments, the gate dielectric film and/or the gate electrode layer may respectively, for example, be deposited and/or grown by CVD, PVD, ALD, thermal oxidation, sputtering, another suitable deposition process, or a combination of the foregoing. In some embodiments, the gate dielectric layer 202 may, for example, be or comprise silicon oxide, a high-k dielectric material, or the like. In further embodiments, the transfer gate electrode 109 and/or the readout gate electrode 122 may respectively, for example, be or comprise a metal (e.g., aluminum, titanium, etc.), polysilicon, or another suitable conductive material. Further, after forming the transfer gate electrodes 109 and/or the readout gate electrode 122, a selective ion implant process may be performed to form lightly doped regions 816 in the readout transistor well region 204 on opposing sides of the readout gate electrode 122. The lightly doped regions 816 may, for example, comprise the second doping type (e.g., n-type) with a doping concentration less than the isolation region 808.

Figure 14:
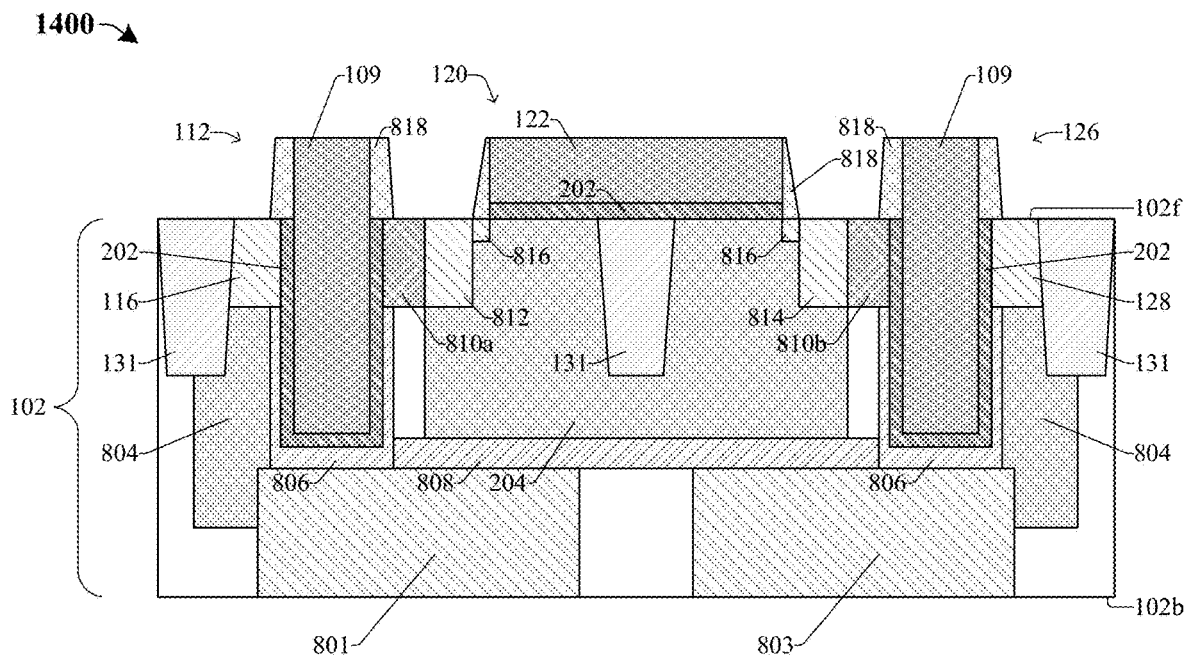

As shown in cross-sectional view 1400 of FIG. 14, sidewall spacer structures 818 are formed on the front-side 102f of the substrate 102 and along sidewalls of the transfer gate electrodes 109 and the readout gate electrode 122. Further, a first floating diffusion node 116, a second floating diffusion node 128, a first junction isolation structure 810a, a second junction isolation structure 810b, and source/drain regions 812, 814 are formed on the front-side 102f of the substrate 102. This defines the first transfer transistor 112 over the first photodetector 801, the second transfer transistor 126 over the second photodetector 803, and the readout transistor 120 over the first and second photodetectors 801, 803. The first and second floating diffusion nodes 116, 128 and the source/drain regions 812, 814 each have the second doping type (e.g., n-type) with a higher doping concentration than the lightly doped regions 816. The first and second junction isolation structures 810a-b each have the first doping type (e.g., p-type) with a doping concentration within a range of about $10^{17}$ to $10^{19}$ atoms/cm$^3$.

In some embodiments, the lightly doped regions 816 and the source/drain regions 812, 814 may each comprise the first doping type (e.g., p-type). In such embodiments, the readout transistor well region 204 and the first and second junction isolation structures 810a-b may each comprise the second doping type (e.g., n-type).

In some embodiments, with reference to FIG. 6, the first junction isolation structure 810a may correspond to the junction isolation structure 118c disposed along a first sidewall 122csw1 of the third readout transistor 120c. Further, the second junction isolation structure 810b may correspond to the junction isolation structure 118d disposed along a second sidewall 122csw2 of the third readout transistor 120c. In such embodiments, the source/drain regions 124e-h may be formed concurrently with the source/drain regions 812. Further, the first and second isolation structures 810a-b may each be formed in such a manner that they are configured as the junction isolation structure 118c of FIG. 3B or the junction isolation structure of FIG. 3C.

In some embodiments, the sidewall spacer structures 818 may be formed by depositing (e.g., by CVD, PVD, ALD, etc.) a spacer layer over the front-side 102f of the substrate 102. The spacer layer is subsequently etched, thereby forming the sidewall spacer structures 818 around sidewalls of the transfer gate electrodes 109 and around sidewalls of the readout gate electrode 122. In some embodiments, the spacer layer may, for example, be or comprise a nitride, an oxide, or some other suitable dielectric material. In some embodiments, the first and second floating diffusion nodes 116, 128, the source/drain regions 812, 814, and the first and second junction isolation structures 810a-b may respectively be formed by at least one selective ion implantation process that utilizes a masking layer (not shown) on the front-side 102f of the substrate 102 to selectively implant ions (e.g., n-type such as phosphorus or p-type such as boron) into the substrate 102. In further embodiments, an anneal process (e.g., laser anneal, rapid thermal anneal (RTA), etc.) is performed after the at least one selective ion implantation process to activate the selectively implanted dopants.

In some embodiments, with reference to FIG. 6, the readout transistor 120 corresponds to the third readout transistor 120c of the first pixel sensor 106. In such embodiments, the readout transistor 120 continuously laterally extends between the first and second pixel sensors 106, 108. Further, with reference to FIG. 6, the first transfer transistor 112 corresponds to the second transfer transistor 112b of the first pixel sensor 106, and the second transfer transistor 126 corresponds to the second transfer transistor 126b of the second pixel sensor 108.

Figure 15:
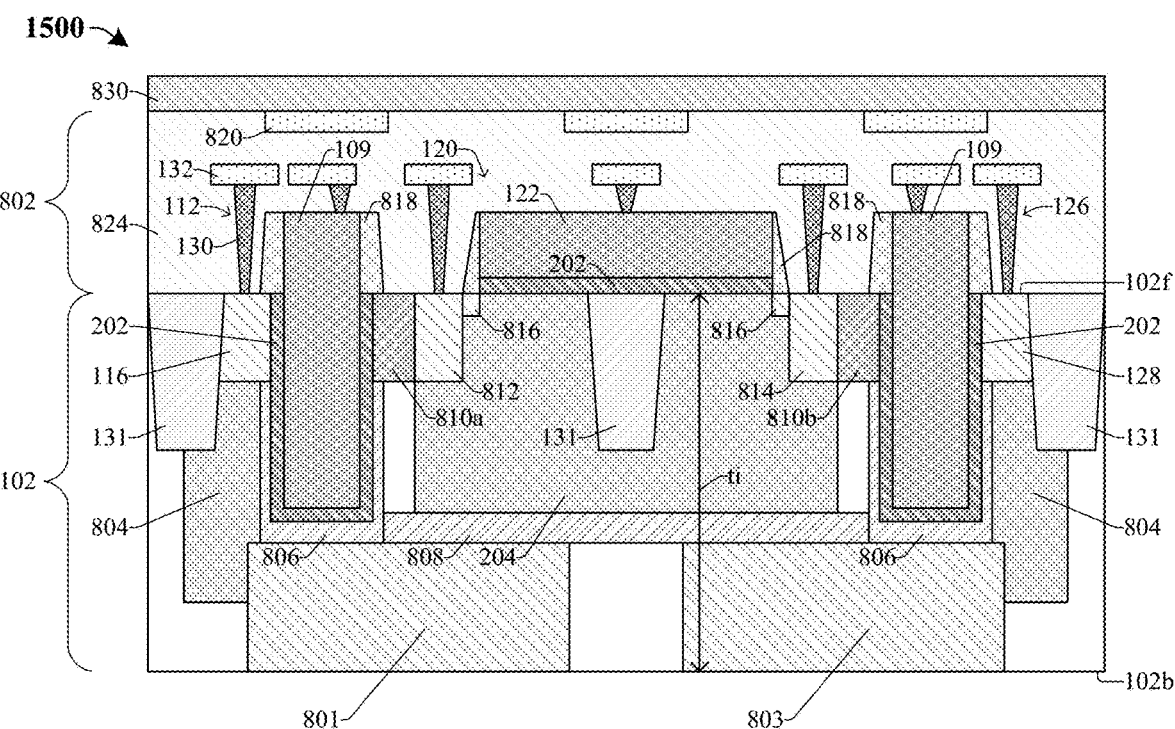

As shown in cross-sectional view 1500 of FIG. 15, an interconnect structure 802 is formed over the front-side 102f of the substrate 102. The interconnect structure 802 includes an interconnect dielectric structure 824, a plurality of conductive vias 130, a plurality of conductive wires 132, and conductive bond pads 820. In some embodiments, the interconnect dielectric structure 824 may be formed with a substantially planar upper surface and may include one or more dielectric layers respectively comprising, for example, an oxide, a nitride, a low-k dielectric material, or the like. In some embodiments, the interconnect dielectric structure 824 may be formed by CVD, PVD, ALD, or the like. In further embodiments, a planarization process (e.g., a chemical-mechanical planarization (CMP) process) may be performed on the interconnect dielectric structure 824 to form the substantially planar upper surface.

In some embodiments, the plurality of conductive vias 130 are formed in the interconnect dielectric structure 824. Further, the conductive vias 130 extend from the conductive wires 132 to doped regions of the substrate 102 (e.g., source/drain regions 812, 814) and/or to transistor gate electrodes (e.g., transfer gate electrodes 109, the readout gate electrode 122, etc.). Furthermore, an upper surface of the conductive bond pads 820 are aligned with the substantially planar upper surface of the interconnect dielectric structure 824. The conductive bond pads 820 are electrically coupled to the conductive vias 130 and the conductive wires 132 (not shown). In some embodiments, a process for forming the conductive vias 130 includes depositing a lower portion of the interconnect dielectric structure 824, subsequently performing an etch into the lower portion to form via openings that correspond to the conductive vias 130. In further embodiments, the via openings may be filled by depositing or growing a conductive material (e.g., tungsten) covering the interconnect dielectric structure 824 that fills the contact openings, and subsequently performing a planarization process (e.g., CMP) on the conductive vias 130 and the interconnect dielectric structure 824.

Also shown in FIG. 15, the conductive wires 132 and/or the conductive bond pads 820 are formed in the interconnect dielectric structure 824. In some embodiments, a process for forming the conductive wires 132 and/or the conductive bond pads 820 includes: 1) depositing an upper portion of the interconnect dielectric structure 824; 2) forming a masking layer (not shown) over the upper portion; 3) performing an etch process into the upper portion to form openings that correspond to the conductive wires 132 and/or the conductive bond pads 820; 4) filling the openings with a conductive material (e.g., copper, aluminum, etc.); and 5) subsequently performing a planarization process (e.g., a CMP) on the conductive material. Further, the substrate 102 has an initial thickness ti defined from the front-side 102f of the substrate 102 to a back-side 102b of the substrate 102. The front-side 102f is opposite the back-side 102b. In some embodiments, the conductive vias 130, the conductive wires 132, and/or the conductive bond pads 820 may respectively, for example, be or comprise tungsten, aluminum, copper, a combination of the aforementioned, or another suitable conductive material. In further embodiments, the conductive bond pads 820 and the interconnect dielectric structure 824 may be bonded (e.g., by a hybrid bonding process) to another IC die 830 (e.g., an integrated circuit (IC) die comprising one or more semiconductor devices, or a carrier substrate). In some embodiments, the another IC die 830 may, for example, be an application-specific integrated circuit (ASIC).

Figure 16:
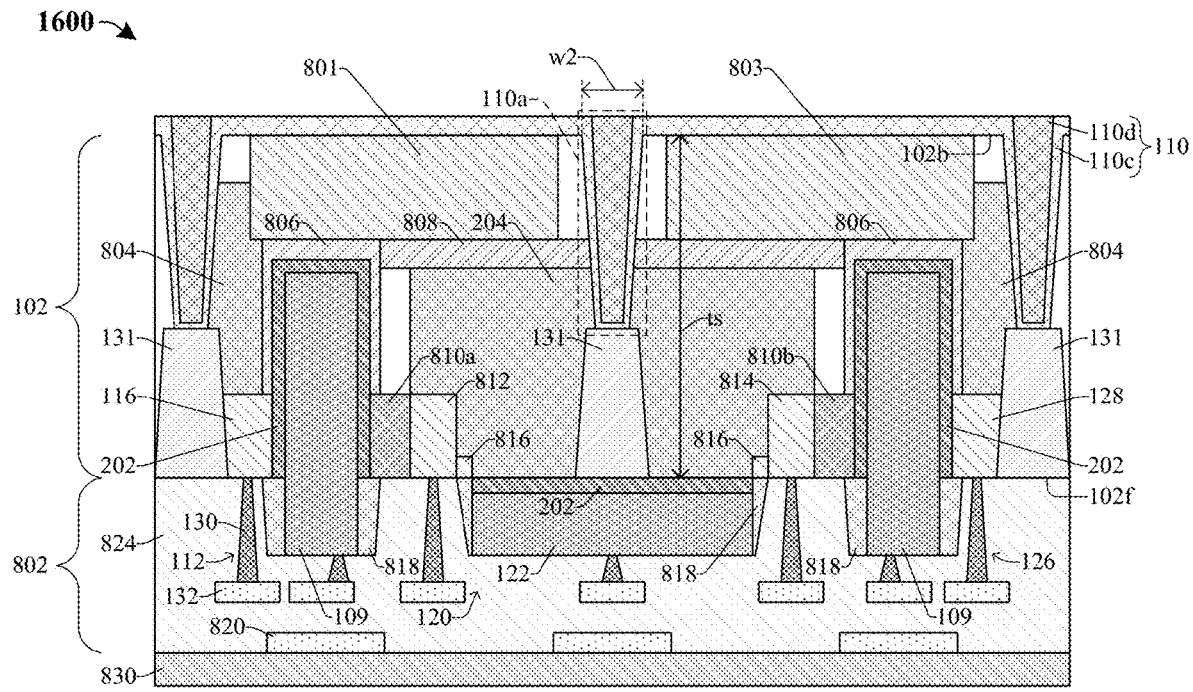

As shown in cross-sectional view 1600 of FIG. 16, the structure of FIG. 15 is flipped (e.g., rotated 180 degrees) and the substrate 102 is thinned from the initial thickness (ti of FIG. 15) to a thickness ts. For example, the initial thickness ti in FIG. 15 is greater than the thickness ts of the substrate 102 in FIG. 16. In some embodiments, the thinning process may, for example, be performed by a planarization process, an etch back process, a grinding process, a combination of the aforementioned, or the like. In further embodiments, the planarization process may wholly be a CMP process. In some embodiments, the thickness ts is within a range of about 2 to 10 micrometers.

Also as shown in FIG. 16, a first isolation structure 110 (in some embodiments, referred to as a deep trench isolation (DTI) structure) is formed in the substrate 102. The first isolation structure 110 extends into the substrate 102 from the back-side 102b to a point below the back-side 102b. In some embodiments, the first isolation structure 110 extends from the back-side 102b to a top surface of the second isolation structure 131. In further embodiments, the first isolation structure 110 extends from the back-side 102b to the front-side 102f of the substrate 102 (not shown). The first isolation structure 110 includes a first isolation layer 110c and a second isolation layer 110d. The first isolation layer 110c extends from the back-side 102b of the substrate 102 to the second isolation structure 131 and may be configured as the anti-reflection layer 502 of FIG. 5. In some embodiments, a process for forming the first isolation structure 110 includes: 1) selectively etching the substrate 102 to form trenches in the substrate 102 that extend into the substrate 102 from the back-side 102b; 2) depositing (e.g., by CVD, PVD, ALD, etc.) the first isolation layer 110c over the substrate 102, thereby filling a portion of the trenches; and 3) filling the remaining portion of the trenches (e.g., by CVD, PVD, ALD, sputtering, etc.) with the second isolation layer 110d. In some embodiments, the first isolation layer 110c may, for example, be or comprise a high-k dielectric material, an oxide (e.g., silicon dioxide), silicon nitride (e.g., $Si_3N_4$), a combination of the foregoing, or the like. In some embodiments, the second isolation layer 110d may, for example, be or comprise a high-k dielectric material, an oxide (silicon dioxide), silicon nitride (e.g., $Si_3N_4$), polysilicon, tungsten, aluminum, copper, or the like. In further embodiments, the second isolation layer 110d may comprise a conductive segment surrounded by a dielectric layer, for example, a conductive pillar (e.g., copper) lined by an insulator dielectric layer (e.g., a high-k dielectric material) (not shown). In some embodiments, the readout gate electrode 122 laterally extends across an entire width w2 of a segment 110a of the first isolation structure 110.

Figure 17:
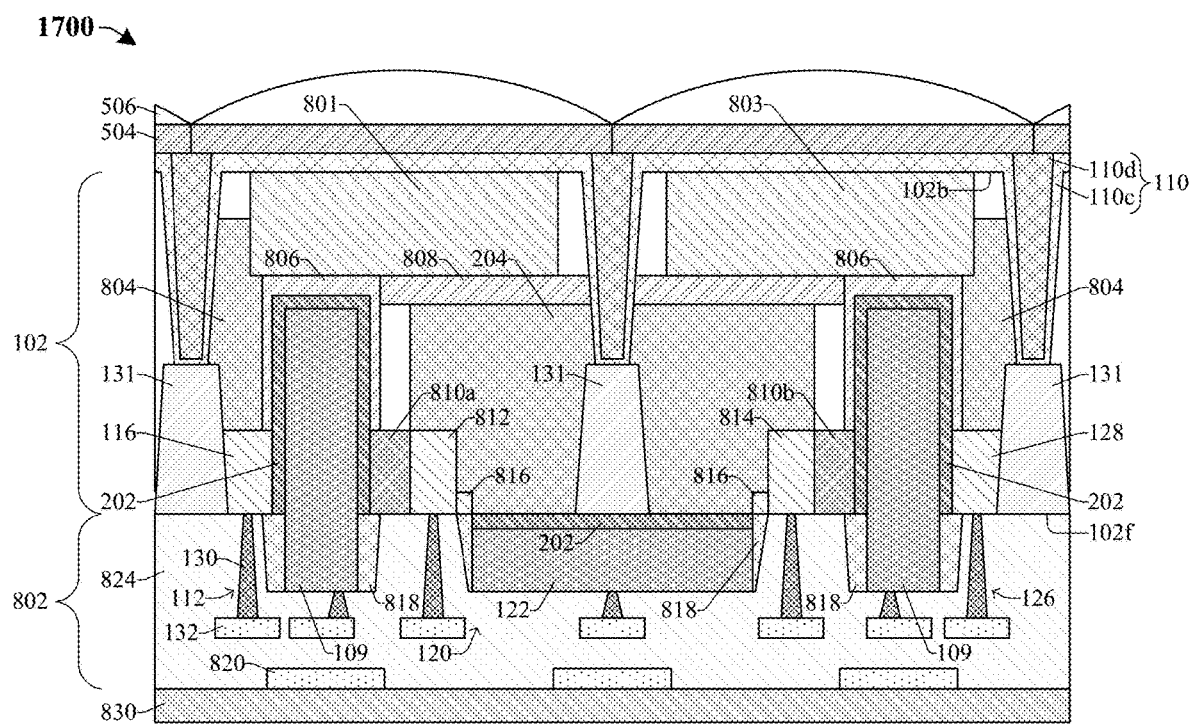

As shown in cross-sectional view 1700 of FIG. 17, a plurality of color filters 504 is formed over the first isolation structure 110. The color filters 504 are forming of material(s) that allow for the transmission of incident radiation (e.g., light) having a specific wavelength range, while blocking incident wavelength with another wavelength outside of the specified range. In further embodiments, the color filters 504 may be formed by CVD, PVD, ALD, or the like and/or may be planarized (e.g., via a CMP) subsequent to formation. Further, a plurality of micro-lenses 506 are formed over the color filters 504. The plurality of micro-lenses 506 may be formed by depositing a lens material on the color filters 504 (e.g., by a spin-on method or a deposition process). A lens template (not shown) having a curved upper surface is patterned above the lens material. The micro-lenses 506 are then formed by selectively etching the lens material according to the lens template.

Figure 18:
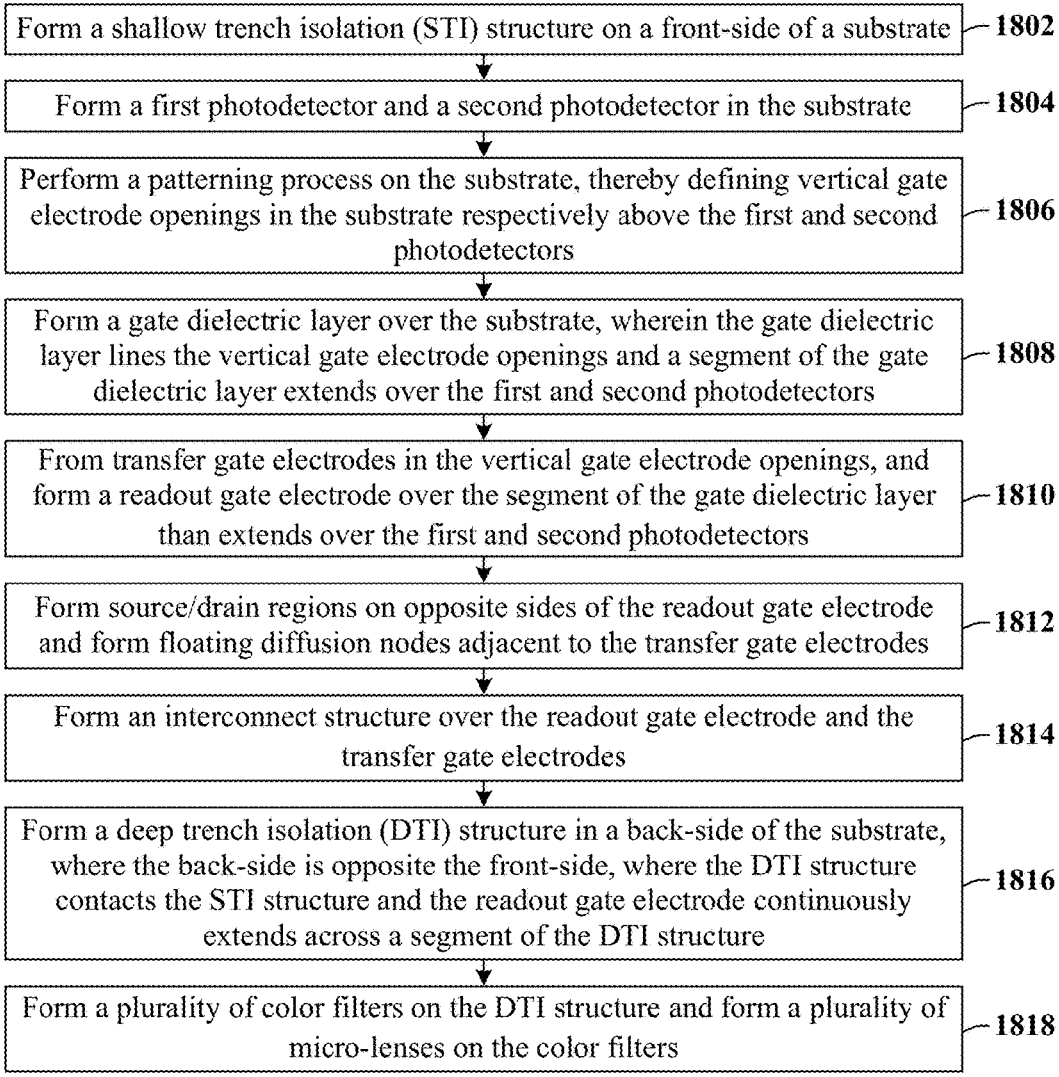
FIG. 18 illustrates a flowchart of some embodiments of a method for forming an image sensor having a pixel device that extends over an isolation structure.

FIG. 18 illustrates a method 1800 of forming an image sensor according to the present disclosure. Although the method 1800 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 1802, a shallow trench isolation (STI) structure is formed on a front-side of a substrate. FIG. 10 illustrates a cross-sectional view 1000 corresponding to some embodiments of act 1802.

At act 1804, a first photodetector and a second photodetector are formed in the substrate. FIG. 11 illustrates a cross-sectional view 1100 corresponding to some embodiments of act 1804.

At act 1806, a first patterning process is performed on the substrate, thereby defining vertical gate electrode openings in the substrate respectively above the first and second photodetectors. FIG. 12 illustrates a cross-sectional view 1200 corresponding to some embodiments of act 1806.

At act 1808, a gate dielectric layer is formed over the substrate. The gate dielectric layer lines the vertical gate electrode openings and a segment of the gate dielectric layer extends over the first and second photodetectors. FIG. 13 illustrates a cross-sectional view 1300 corresponding to some embodiments of act 1808.

At act 1810, a transfer gate electrode is formed in the vertical gate electrode openings. Further, a readout gate electrode is formed over the segment of the gate dielectric layer that extends over the first and second photodetectors. FIG. 13 illustrates a cross-sectional view 1300 corresponding to some embodiments of act 1810.

At act 1812, source/drain regions are formed on opposite sides of the readout gate electrode. Further, floating diffusion nodes are formed adjacent to the transfer gate electrodes. FIG. 14 illustrates a cross-sectional view 1400 corresponding to some embodiments of act 1812.

At act 1814, an interconnect structure is formed over the readout gate electrode and the transfer gate electrodes. FIG. 15 illustrates a cross-sectional view 1500 corresponding to some embodiments of act 1814.

At act 1816, a deep trench isolation (DTI) structure is formed in a back-side of the substrate, wherein the back-side is opposite the front-side. The DTI structure contacts the STI structure and the readout gate electrode continuously extends across a segment of the DTI structure. FIG. 16 illustrates a cross-sectional view 1600 corresponding to some embodiments of act 1816.

At act 1818, a plurality of color filters is formed on the DTI structure, and a plurality of micro-lenses are formed on the color filters. FIG. 17 illustrates a cross-sectional view 1700 corresponding to some embodiments of act 1818.

Accordingly, in some embodiments, the present disclosure relates to an image sensor including an array of pixel sensors each comprising multiple photodetector. A DTI structure extends continuously around each photodetector. A readout transistor continuously laterally extends over the DTI structure and overlies a first pixel sensor and a second pixel sensor.

In some embodiments, the present application provides an image sensor including a first photodetector disposed within a semiconductor substrate; a second photodetector disposed within the semiconductor substrate; an isolation structure extending from a front-side surface of the semiconductor substrate to a back-side surface of the semiconductor substrate, wherein the front-side surface is opposite the back-side surface, and wherein the isolation structure is laterally between the first and second photodetectors; and a readout transistor disposed on the front-side surface of the semiconductor substrate, wherein a first side of the readout transistor overlies the first photodetector and a second side of the readout transistor overlies the second photodetector, wherein the first side is opposite the second side, and wherein the readout transistor continuously extends over the isolation structure.

In some embodiments, the present application provides an image sensor including a first pixel sensor and a second pixel sensor each including a plurality of photodetectors, a plurality of transfer transistors, and a floating diffusion node (FDN), wherein the plurality of photodetectors are disposed within a semiconductor substrate, and wherein the plurality of transfer transistors are disposed on a front-side surface of the semiconductor substrate and selectively electrically couple the plurality of photodetectors to the FDN; an isolation structure disposed within the semiconductor substrate, wherein the isolation structure continuously surrounds each photodetector in the first and second pixel sensors, and wherein the isolation structure completely extends through the semiconductor substrate; a source-follower transistor overlying the first pixel sensor and gated by the FDN of the first pixel sensor; and a row-select transistor overlying the second pixel sensor and having a source/drain region electrically coupled to a source/drain region of the source-follower transistor.

In some embodiments, the present application provides a method for forming an image sensor, the method includes forming a shallow trench isolation (STI) structure on a front-side surface of a semiconductor substrate; forming a first photodetector and a second photodetector in the semiconductor substrate, wherein the first and second photodetectors are laterally separated by the STI structure; forming a readout transistor on the front-side surface, wherein a first sidewall of the readout transistor overlies the first photodetector and a second sidewall of the readout transistor overlies the second photodetector, wherein the first sidewall is opposite the second sidewall, and wherein the readout transistor continuously extends over an upper surface of the STI structure; forming first source/drain regions along the first sidewall of the readout transistor; forming a first junction isolation structure along the first sidewall of the readout transistor, wherein the first junction isolation structure is laterally between the first source/drain regions; and forming a deep-trench isolation (DTI) structure on a back-side surface of the semiconductor substrate, wherein the DTI structure extends from the back-side surface to the STI structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. An image sensor comprising:
a first photodetector disposed within a semiconductor substrate;
a second photodetector disposed within the semiconductor substrate;
a third photodetector neighboring the first photodetector and diagonally opposite from the second photodetector;
an isolation structure extending from a front-side surface of the semiconductor substrate to a back-side surface of the semiconductor substrate, wherein the front-side surface is opposite the back-side surface, and wherein the isolation structure is laterally between the first and second photodetectors;
a readout transistor disposed on the front-side surface of the semiconductor substrate, wherein a first side of the readout transistor overlies the first photodetector and a second side of the readout transistor overlies the second photodetector, wherein the first side is opposite the second side, wherein the readout transistor continuously extends over the isolation structure; and
a reset transistor disposed on the semiconductor substrate and overlying the third photodetector, wherein a first sidewall of the reset transistor is laterally aligned with a first sidewall of the readout transistor on the first side of the readout transistor.

2. The image sensor of claim 1, wherein the readout transistor comprises:
a readout gate electrode, wherein the readout gate electrode continuously extends from over the first photodetector to over the second photodetector;
a first source/drain region disposed along the first sidewall of the readout transistor; and
a second source/drain region disposed along the first sidewall of the readout transistor.

3. The image sensor of claim 2, further comprising:
a junction isolation structure in the semiconductor substrate, laterally between and adjoining the first and second source/drain regions, wherein the junction isolation structure has an opposite doping type as the first and second source/drain regions.

4. The image sensor of claim 3, wherein the junction isolation structure has a sidewall underlying the readout gate electrode, and wherein the sidewall of the junction isolation structure is disposed a non-zero distance away from the first sidewall of the readout transistor in a direction headed towards the second photodetector.

5. The image sensor of claim 1, further comprising:
a floating diffusion node disposed within the semiconductor substrate and above the first photodetector; and
a first transfer transistor laterally adjacent to the floating diffusion node, wherein a top surface of the first transfer transistor is level with a top surface of the readout transistor, wherein the first transfer transistor comprises a first transfer gate electrode, and wherein two or more planar sidewalls of the first transfer gate electrode respectively face a direction toward the floating diffusion node.

6. The image sensor of claim 5, further comprising:
a second transfer transistor disposed above the second photodetector; and
wherein the readout transistor is disposed laterally between the first and second transfer transistors, wherein a first junction isolation structure extends along the first side of the readout transistor and is disposed laterally between the readout transistor and the first transfer transistor, wherein a second junction isolation structure extends along the second side of the readout transistor and is disposed laterally between the readout transistor and the second transfer transistor.

7. The image sensor of claim 1, further comprising:
a fourth photodetector neighboring the second and third photodetectors and diagonally opposite from the first photodetector;
a select transistor disposed on the semiconductor substrate and overlying the fourth photodetector, wherein a first sidewall of the select transistor is laterally aligned with a second sidewall of the readout transistor on the second side of the readout transistor; and
wherein a second sidewall of the reset transistor is opposite the first sidewall of the reset transistor and a second sidewall of the select transistor is opposite the first sidewall of the select transistor, and wherein the isolation structure underlies the second sidewall of the select transistor and the second sidewall of the reset transistor.

8. The image sensor of claim 7, further comprising:
a first select source/drain region and a second select source/drain region disposed along the first sidewall of the select transistor, wherein a select junction isolation structure is disposed between the first and second select source/drain regions; and a first reset source/drain region and a second reset source/drain region disposed along the first sidewall of the reset transistor, wherein a reset junction isolation structure is disposed between the first and second reset source/drain regions.

9. The image sensor of claim 1, wherein the readout transistor has opposite sidewalls extending between the first and second sides of the readout transistor, and wherein the opposite sidewalls are spaced laterally between opposite inner sidewalls of the isolation structure.

10. The image sensor of claim 1, wherein the readout transistor is a source-follower transistor.

11. An image sensor, comprising:
a first pixel sensor and a second pixel sensor each comprising a plurality of photodetectors, a plurality of transfer transistors, and a floating diffusion node (FDN), wherein the plurality of photodetectors are disposed within a semiconductor substrate, and wherein the plurality of transfer transistors are disposed on a front-side surface of the semiconductor substrate and selectively electrically couple the plurality of photodetectors to the FDN;
an isolation structure disposed within the semiconductor substrate, wherein the isolation structure continuously surrounds each photodetector in the first and second pixel sensors, and wherein the isolation structure completely extends through the semiconductor substrate;
a source-follower transistor overlying the first pixel sensor and gated by the FDN of the first pixel sensor; and
a row-select transistor overlying the second pixel sensor and having a source/drain region electrically coupled to a source/drain region of the source-follower transistor.

12. The image sensor of claim 11, wherein the source-follower transistor continuously extends from a first photodetector in the first pixel sensor to a second photodetector in the second pixel sensor, and wherein the source-follower transistor continuously extends over a segment of the isolation structure that is disposed between the first and second photodetectors.

13. The image sensor of claim 11, wherein the isolation structure includes a shallow trench isolation (STI) structure and a deep trench isolation (DTI) structure, wherein the STI structure extends from the front-side surface of the semiconductor substrate to a point below the front-side surface, wherein the DTI structure extends from a back-side surface of the semiconductor substrate to the point, and wherein the front-side surface is opposite the back-side surface.

14. The image sensor of claim 11, wherein the first pixel sensor comprises a first pixel well and a second pixel well, and wherein the image sensor further comprises:
a third pixel sensor neighboring the first pixel sensor and comprising a third pixel well and a fourth pixel well, wherein the third pixel well is diagonally opposite from the second pixel well and the fourth pixel well is diagonally opposite from the first pixel well; and
an H-shaped wire having four ends respectively overlying and electrically coupled to the first pixel well, the second pixel well, the third pixel well, and the fourth pixel well.

15. The image sensor of claim 11, further comprising:
a reset transistor disposed over a third pixel sensor, wherein the third pixel sensor neighbors the first pixel sensor; and
a single conductive wire extending laterally across the isolation structure from a first end of the single conductive wire to a second end of the single conductive wire, wherein the first end overlies a second source/ drain region of the source-follower transistor and the second end overlies a source/drain region of the reset transistor.

16. The image sensor of claim 11, further comprising:
a pickup well contact region having a same doping type as and directly on a pixel well region disposed along a sidewall of a photodetector in the first pixel sensor;
a substrate contact via directly electrically coupled to the pickup well contact region; and
a power supply via directly electrically coupled to a second source/drain region of the source-follower transistor, wherein a distance between the substrate contact via and the power supply via is less than a distance to any other conductive via in the image sensor.

17. The image sensor of claim 11, wherein the source-follower transistor comprises:
a readout gate electrode disposed on the front-side surface of the semiconductor substrate;
a first source/drain region and a second source/drain region disposed along a first sidewall of the readout gate electrode, wherein a first junction isolation structure extends along the first sidewall and is disposed laterally between the first and second source/drain regions; and
an insulator layer disposed between the readout gate electrode and the semiconductor substrate, wherein the insulator layer extends along a side of the first junction isolation structure.

18. An image sensor comprising:
a first photodetector disposed within a semiconductor substrate;
a second photodetector disposed within the semiconductor substrate;
a shallow trench isolation (STI) structure extending from a front-side surface of the semiconductor substrate to a first point below the front-side surface;
a deep trench isolation (DTI) structure extending from the first point to a back-side surface of the semiconductor substrate, wherein the front-side surface is opposite the back-side surface; and
a readout gate electrode overlying the front-side surface, wherein a first sidewall of the readout gate electrode overlies the first photodetector and a second sidewall of the readout gate electrode overlies the second photodetector, wherein a bottom surface of the readout gate electrode contacts and extends along a top surface of the STI structure.

19. The image sensor of claim 18, wherein the STI structure and the DTI structure are spaced laterally between the first photodetector and the second photodetector.

20. The image sensor of claim 18, further comprising:
a readout gate dielectric layer disposed between the readout gate electrode and the front-side surface of the semiconductor substrate, wherein the readout gate dielectric layer continuously laterally extends from a sidewall of the STI structure to the first sidewall of the readout gate electrode.

* * * * *